United States Patent [19]

Vokac et al.

[11] Patent Number: 4,613,974
[45] Date of Patent: Sep. 23, 1986

[54] METHOD AND SYSTEM FOR MODULATING A CARRIER SIGNAL

[76] Inventors: Peter R. Vokac, 7835 N. Avenida de Carlotta, Tucson, Ariz. 85704; Richard C. Gerdes, 4645 E. Quivira, Tucson, Ariz. 85718

[21] Appl. No.: 590,281

[22] Filed: Mar. 16, 1984

[51] Int. Cl.⁴ .......................... H03K 7/00; H03K 9/00
[52] U.S. Cl. ..................................... 375/37; 375/121; 332/9 R; 329/104
[58] Field of Search ................. 358/143, 145; 381/31; 360/39, 44; 369/59; 370/9, 37, 119; 332/9 R, 15, 68; 329/104, 105, 106, 207; 307/263, 517; 375/22, 37, 121; 328/185

[56] References Cited

U.S. PATENT DOCUMENTS

| | | | |
|---|---|---|---|
| 2,492,004 | 12/1949 | Potier | 370/9 |
| 4,015,211 | 3/1977 | Sanchez | 329/106 |
| 4,320,521 | 3/1982 | Bulakrishnan et al. | 307/263 |
| 4,333,108 | 6/1982 | Quan et al. | 358/145 |
| 4,336,512 | 6/1982 | Vries | 375/22 |
| 4,341,964 | 7/1982 | Chi et al. | 307/517 |
| 4,438,466 | 3/1984 | Fawkes et al. | 307/263 |

OTHER PUBLICATIONS

Electronic Engineering, Mar. 1967, pp. 174-176, "Combination Leading and Trailing Edge Variable Slope Pulse Modulation".

Primary Examiner—Benedict V. Safourek
Attorney, Agent, or Firm—Cahill, Sutton & Thomas

[57] ABSTRACT

A system and method for modulating a carrier signal wherein occurrence of the peaks in the modulated carrier signal conveys clocking information and each transition of a modulated carrier signal includes two midrange characteristics, the ratio of which represents data carried by that transition. Either analog or digital circuit techniques can be utilized to produce the modulated carrier signal, and either analog or digital techniques can be used to demodulate the modulated carrier signal in various embodiments of the invention. In an analog version of the modulator, a sinusoidal carrier signal is squared, alternate cycles of the squared waveform are phase shifted and clocked into analog multipliers, the gains of which are varied in response to an input data signal, the total gains being equal to a constant, and the multiplier outputs are summed to produce the modulated carrier signal. The ratios of the slopes of each transition represent the data. In an analog demodulator, the modulated signal is differentiated to obtain the slopes of the two portions of each transition and the peak values of the derivative signals are sampled, stored, and ratioed by means of an analog divider. $2^N$ different levels of the modulated carrier signal can be used to represent the state of N digital bits.

66 Claims, 16 Drawing Figures

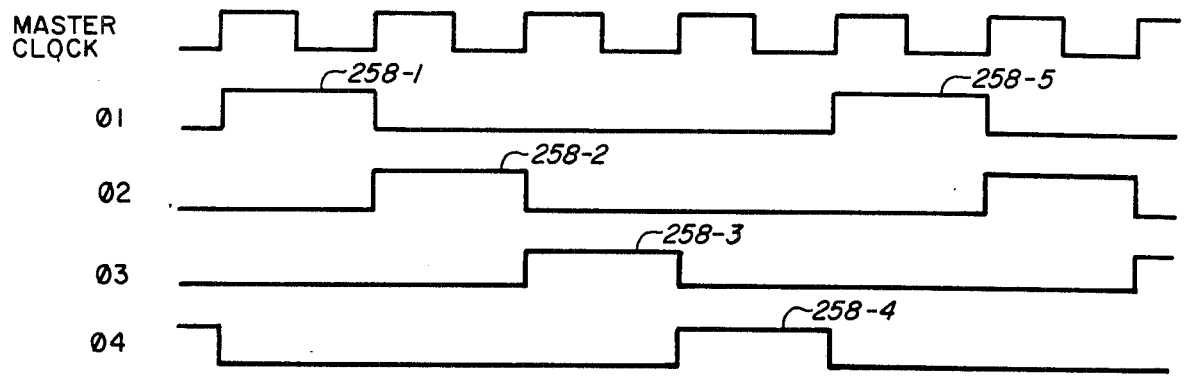
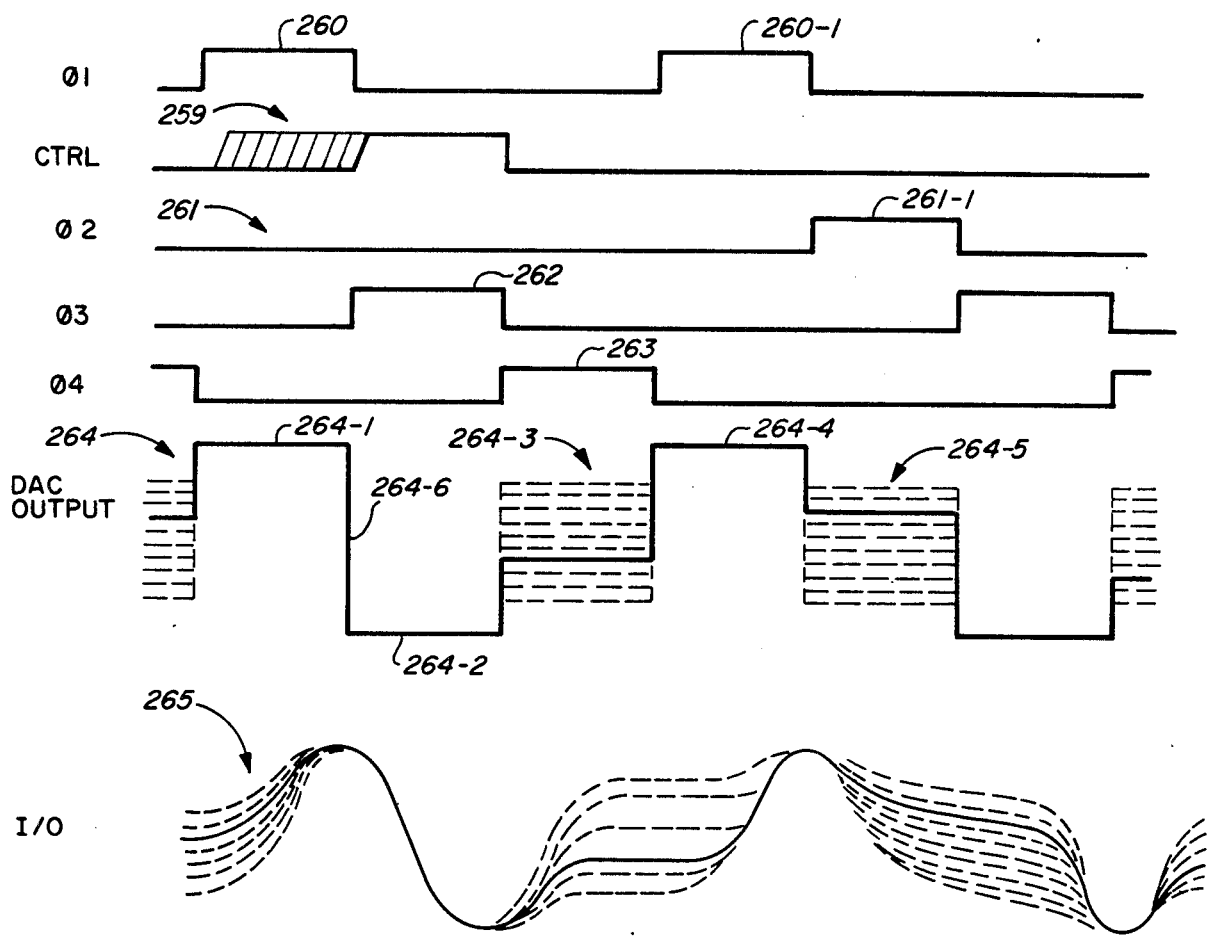

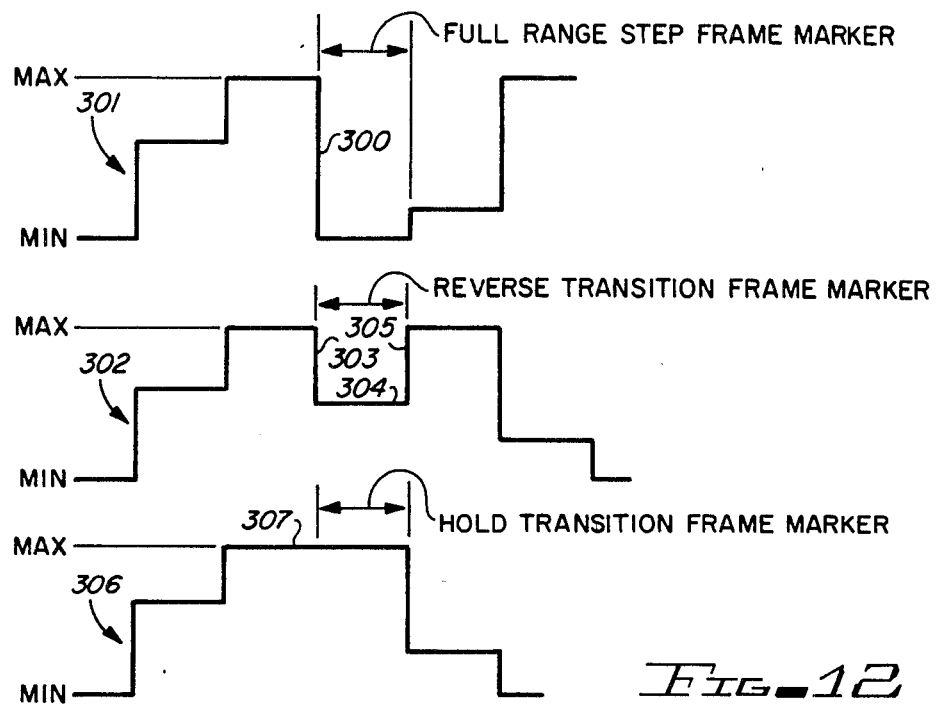
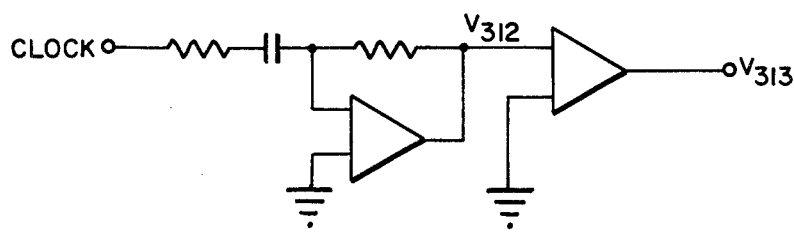
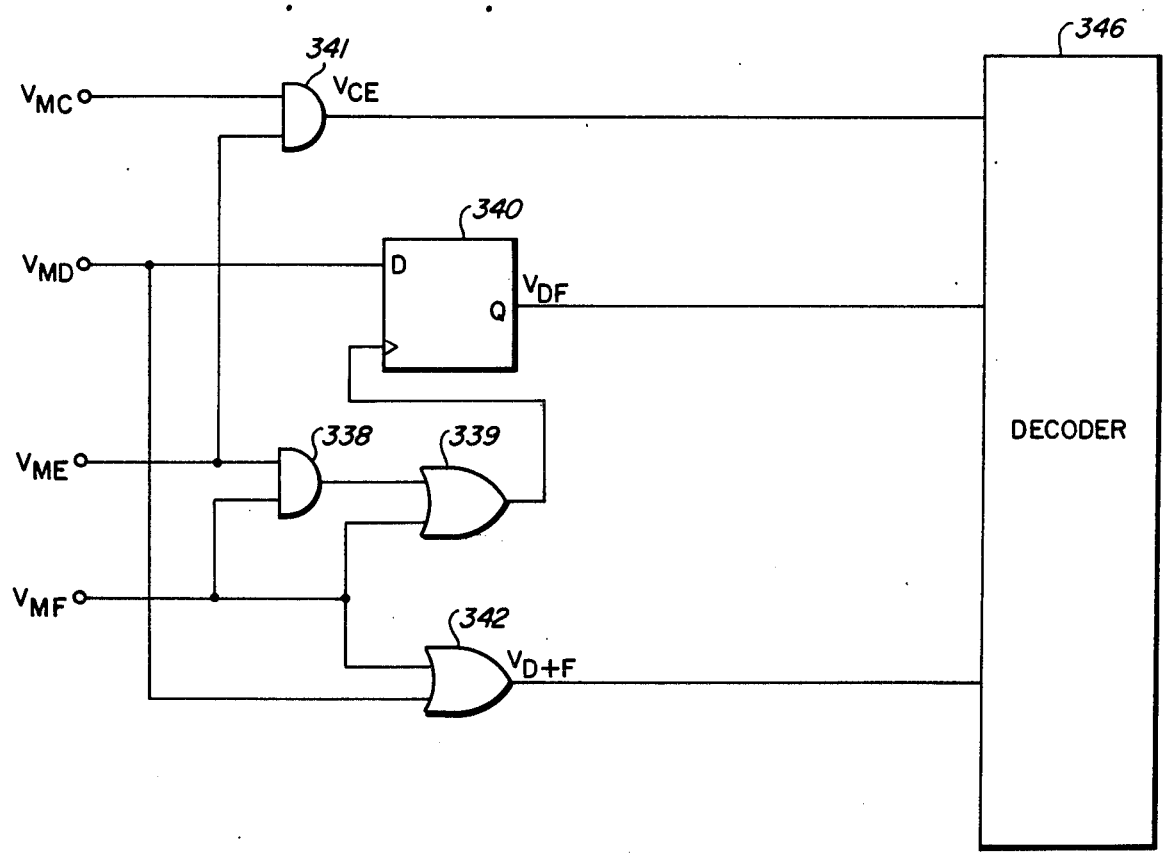

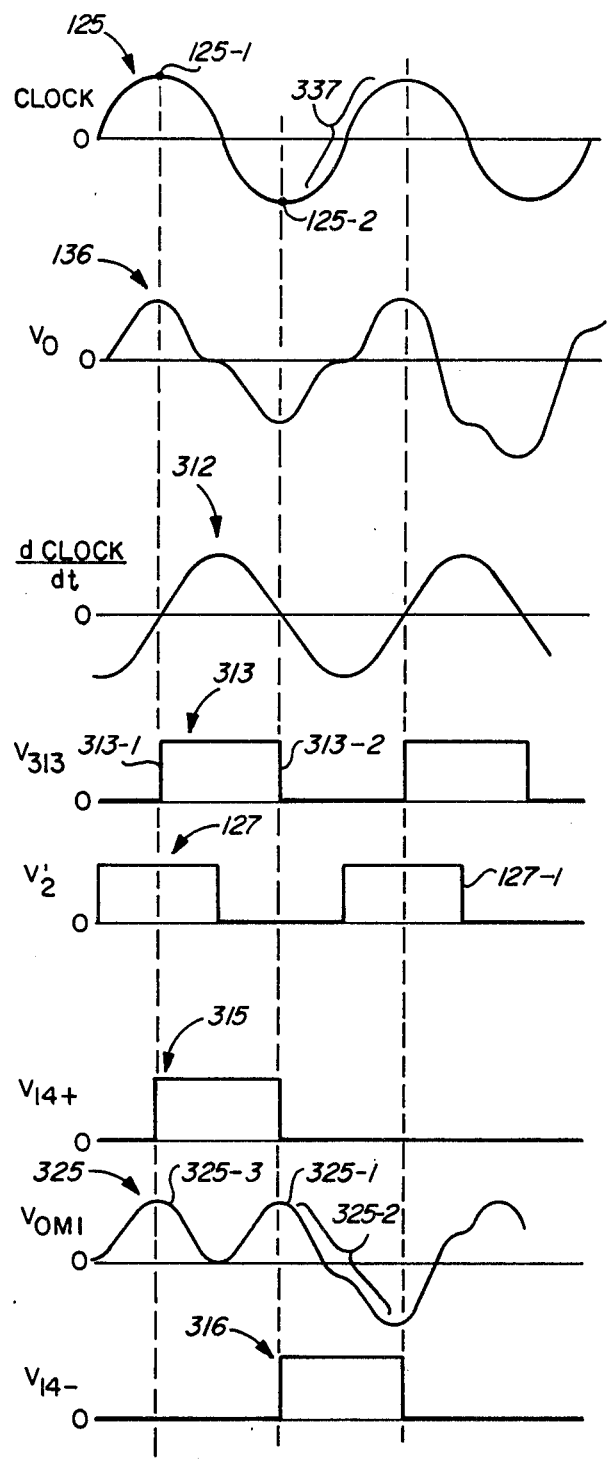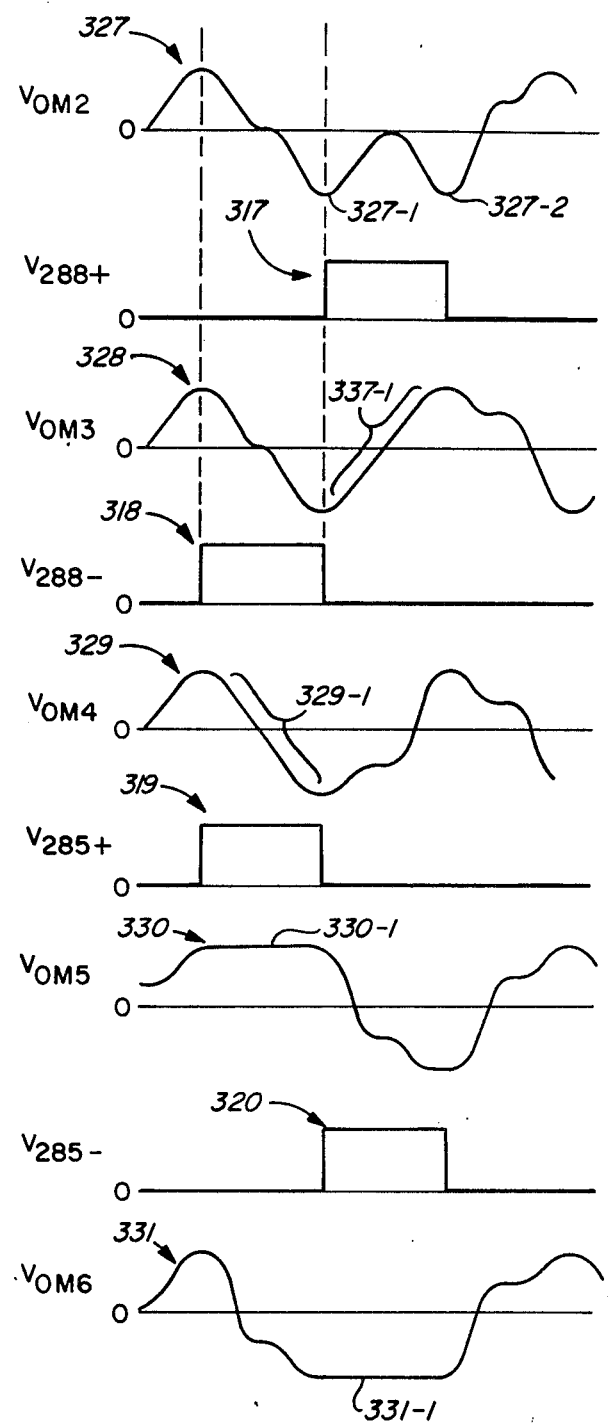
Fig-13B

METHOD AND SYSTEM FOR MODULATING A CARRIER SIGNAL

BACKGROUND OF THE INVENTION

The invention relates to techniques for modulating carrier signals, and more particularly to techniques for modulating a carrier signal independently of the amplitude, frequency, and phase of the carrier signal to cause each half cycle of the carrier signal to represent the state of a plurality of digital bits, and to techniques for demodulating such a carrier signal, and to techniques for generating frame markers therefore.

A variety of modulation techniques are very well known, including amplitude modulation, frequency modulation, and phase modulation. Although it is possible to transmit digital pulses directly along a communications medium, especially a wire or optical medium, it usually is not practical to transmit large amounts of data directly in digital form via a wireless communication link. Consequently, digital data is "encoded" into high frequency modulated carrier signals using various pulse coded modulation (PCM) techniques, such as high frequency shift keying (FSK) techniques. All of these techniques require at least several cycles of the carrier signal for each digital bit transmitted.

Such digital data, encoded in analog form into modulated high frequency sinusoidal carrier signals by well known modulation techniques, is often received by a receiver and stored as received on magnetic tape for archival purposes, and when it is necessary to be retrieved from the magnetic tape, the modulated signals are played back from tape, fed into a demodulator, and then converted to digital form.

The state of the art in transmission of digital data and modulation techniques is believed to be indicated by U.S. Pat. Nos. 3,993,862; Re-issue 30,182; 4,106,007; 4,227,250; 4,236,248; 4,339,823; 3,764,743; 3,821,481; and 3,755,739.

It would be desirable to have a technique for inexpensively modulating a carrier signal independently of its frequency, amplitude, and phase. It would also be desirable to have a technique for encoding or modulating a carrier signal to contain information which can be faithfully demodulated, despite considerable distortion imposed upon the modulated carrier signal by the communications channel. It would also be desirable to have a technique for encoding or modulating a carrier signal so that every half cycle of the carrier signal contains information representative of the logical states of a plurality of digital bits. It would also be desirable to have a more economical, higher density storage of digital information than is presently available.

Therefore, it is an object of the invention to provide a new and improved system and apparatus for modulating a carrier signal independently of its frequency, amplitude, and phase.

It is another object of the invention to provide a system and method for modulating a carrier signal so that each half cycle of the modulated carrier signal contains information which represents the states of a plurality of digital bits.

It is another object of the invention to provide a system and method for modulating and demodulating a carrier signal so that the demodulated information faithfully reproduces the modulation data despite severe distortions imposed upon the modulated carrier signal by the communications and/or recording medium.

It is another object of the invention to provide a technique for greatly increasing the amount of digital information that can be stored in an encoded analog format on magnetic tape or other media, such as plate optical media or other media capable of recording analog signals.

It is another object of the invention to provide a modulation and demodulation signal that greatly increases the amount of information that can be communicated on a communications channel.

It is another object of the invention to provide a system and method for greatly increasing the speed at which analog and/or digital information can be communicated through a communications channel.

It is another object of the invention to provide a new modulation/demodulation technique that can be used to independently modulate/demodulate signals which are simultaneously being modulated or demodulated using prior modulation/demodulation techniques.

It is another object of the invention to provide a highly efficient digital encoding format that is compatible with conventional video systems so that relatively inexpensive conventional analog hardware can be utilized by digital data systems.

It is another object of the invention to provide an inexpensive and effective means of digital audio recording and playback.

It is another object of the invention to provide a modulation technique that can make the recording, transmission and playback of digital image video much less expensive than it has been heretofore.

SUMMARY OF THE INVENTION

Briefly described and in accordance with one embodiment thereof, the invention provides a system and method for producing a signal having the form of a modulated carrier signal wherein in each data-carrying transition, a mid-range ratio associated with two charactristics of that transition represents the data carried by that transition. The mid-range ratio can be the ratio of the slope of one portion of the transition to the sum of two slopes of the transistion, or it can be the ratio of the level of a mid-range, relatively horizontal portion of the transition to the peak-to-peak level of the transition. The peaks of the modulated carrier signal can carry clocking information useful in demodulating the modulated carrier signal.

In one described embodiment of the invention, the carrier signal initially is sinusoidal. The amplitude of a relatively horizontal level modulated between successive positive and negative peaks is a predetermined portion of the peak-to-peak amplitude of the carrier signal representing a corresponding fraction of an input signal relative to the maximum. The ratio of the slope of the leading portion of the transition to the sum of the slopes of the leading and trailing portions of the transitions also represents or corresponds to the corresponding ratio of the level of the input signal to the level of its maximum. Demodulation is accomplished in one of two basic ways, either by measuring the slopes of the leading and trailing portions of each transition and obtaining the ratio of one of the two slopes to the sum of the two slopes, or by sampling the amplitude of the modulated signal at the beginning of the first transition, at the relatively level portion of the transition and at the end of the transition, and then taking the ratio of the intermediate level to the peak-to-peak amplitude to recover a quantity corresponding to the modulating data level (of the input signal). In a described embodiment of the invention, a sinusoidal carrier signal is squared, and even numbered cycles of the squared carrier signal are gated by an analog switch to the input of a first analog multiplier. Odd numbered cycles of the squared carrier signal are inverted and gated by an analog switch to an input of a second analog multiplier. The outputs of the two analog multipliers are resistively summed. The second input of each of the two analog multipliers is varied in accordance with the modulation data level of the input signal so that the total value of the signals applied to the second inputs of the two analog multipliers is equal to unity. The output signal produced by summing the outputs of the two analog multipliers is the modulated carrier signal, each transition thereof having an upper and lower portion separated by an intermediate, relatively level portion, the slopes and intermediate level representing the modulating data. In the described embodiment of the invention, the modulating data is produced by performing a digital-to-analog conversion of a plurality of N digital bits for each transition of the carrier signal to be modulated, in order to produce one of $2^N$ discrete levels as the value of the intermediate level of that transition.

Demodulation of the modulated carrier signal, or a replica thereof arriving at the opposite end of a communication channel, is differentiated by a differentiating circuit that separates derivative pulses representing the slopes of negative going transitions and positive-going transitions. Each transition produces two derivative pulses, the peak amplitudes of which are sampled by peak sense and hold circuits. The outputs of the peak sense and hold circuits are summed to produce a signal representative of the peak to peak amplitude of the modulated carrier signal at the time of the present transition. A signal representing the sum of the derivative peaks and a signal representing one of the derivative peaks are input to an analog divider which computes a signal that is representative of the ratio of one of the slopes of a particular transition to the sum of the slopes thereof and which therefore represents the present value of the modulating or input signal. This value is converted by means of an analog-to-digital converter circuit back to the level of the original N digital bits. Since the position of the peaks of the modulated carrier signal are detected with a peak sense and hold circuit, even if the peak is being frequency modulated or amplitude modulated, its occurrence is detected by the demodulator circuit and the data represented by the midrange ratios is recovered.

The presence of a transition without an intermediate level is interpreted as a frame marker. The encoding circuit produces various such frame markers causing direct full range transitions within a half cycle of the carrier signal, holding the carrier signal at a maximum or minimum level for a full half cycle of the carrier signal, and/or causing reverse transitions from a maximum or minimum level of the carrier signal to an intermediate level and back during a half cycle of the carrier signal. In a described embodiment of the invention, the encoded analog signal can be stored on magnetic tape (and later played back and fed to the demodulator) to thereby produce an extremely high density of encoding analog or digital information on magnetic tape or other medium. The amount of information per cycle of the modulated carrier signal is many times that of conventional modulation techniques for analog information or for digitally encoded information in analog form.

In accordance with another embodiment thereof, the invention provides a system and method for producing a signal in the form of a carrier signal of a certain peak-to-peak amplitude and frequency that is comprised of alternating amplitude-modulated half-cycles of exactly twice the carrier frequency. Information is carried in pairs of these half-cycles which are joined internally by a 180° phase flip. The sum of the amplitudes of the half-cycles in each pair is constant and equal to the peak-to-peak amplitude of the carrier. Each pair is joined without a phase flip to adjacent pairs. The pairs are of two kinds, rising and falling. Each such transition carries a multilevel byte of information in the amplitude ratio between flip-to-peak and peak-to-peak levels. Peaks between pairs carry sample clock information. The pairs of half-cycles herein described are called "AUDEL pairs" by the inventors.

An alternate embodiment of the invention involves the digital generation and recovery of non-sinusoidal digital AUDEL pairs. One simple digital modulation process produces a sequence of "square" levels alternating between high, mid-range, low, midrange, high levels etc., where the highs are equal to each other and greater than any mid-range value, and the lows are equal to each other and less than any mid-range value. Refinements of this digital process utilize more samples per carrier cycle to more closely approximate the desired modulation. For both analog and digital implementations of the technique, a full range transition in a single step, either high-to-low or low-to-high, is interpreted as a frame marker; a transition from a positive or negative peak level to a mid-level and back to that peak level also is interpreted as a frame marker. Holding the carrier signal at either a positive or a negative peak level for an entire half cycle of the carrier signal also is interpreted as a frame marker.

Clock information (i.e., digital sample clock information) is recovered by phase locking a synchronous oscillator to the detected peaks of the modulated carrier signal. All registers in this circuit are updated on the leading edge of the sample clock. All data in this circuit is passed through ratio logic circuitry and threshold and partition logic circuitry during each sample clock cycle. Maxima and minima from the previous cycle are held in registers for presentation to the ratio logic circuitry. The analog peak detector circuitry determines whether the current sample is a high peak, a low peak, or a midrange datum, and generates appropriate control signals. A "previous value register" and a comparator performs a subtraction and magnitude comparison to determine if the current sample is a frame marker. New "data" is presented at an output port along with a flag signal. Any frame marker signal that occurs is produced at a separate digital output.

This mostly digital embodiment of the invention is less bandwidth-efficient and less noise resistant than other embodiments that fully utilize analog peak slope and phase transition detectors. However, this "digital" embodiment is both simpler and less expensive than the "analog" implementations of the invention, and is very amenable to digital large scale integration.

BRIEF DESCRIPTION OF THE DRAWINGS

FIGS. 8A and 8B are timing diagrams useful in explaining the modulator of FIG. 6.

FIG. 12 is a timing diagram useful in explaining various frame markers tht can be produced by the digital modulator circuit of FIG. 6.

FIG. 13A is a schematic diagram of a circuit useful in generating waveforms shown in FIG. 13B in conjunction with producing various frame markers.

FIG. 13B includes timing diagrams that are useful in explaining generation of frame markers by the analog modulator circuit of FIG. 1.

FIG. 14 is a diagram of a digital frame marker decoder circuit used in conjunction with the analog demodulator of FIG. 2.

DESCRIPTION OF THE INVENTION

Figure 1:
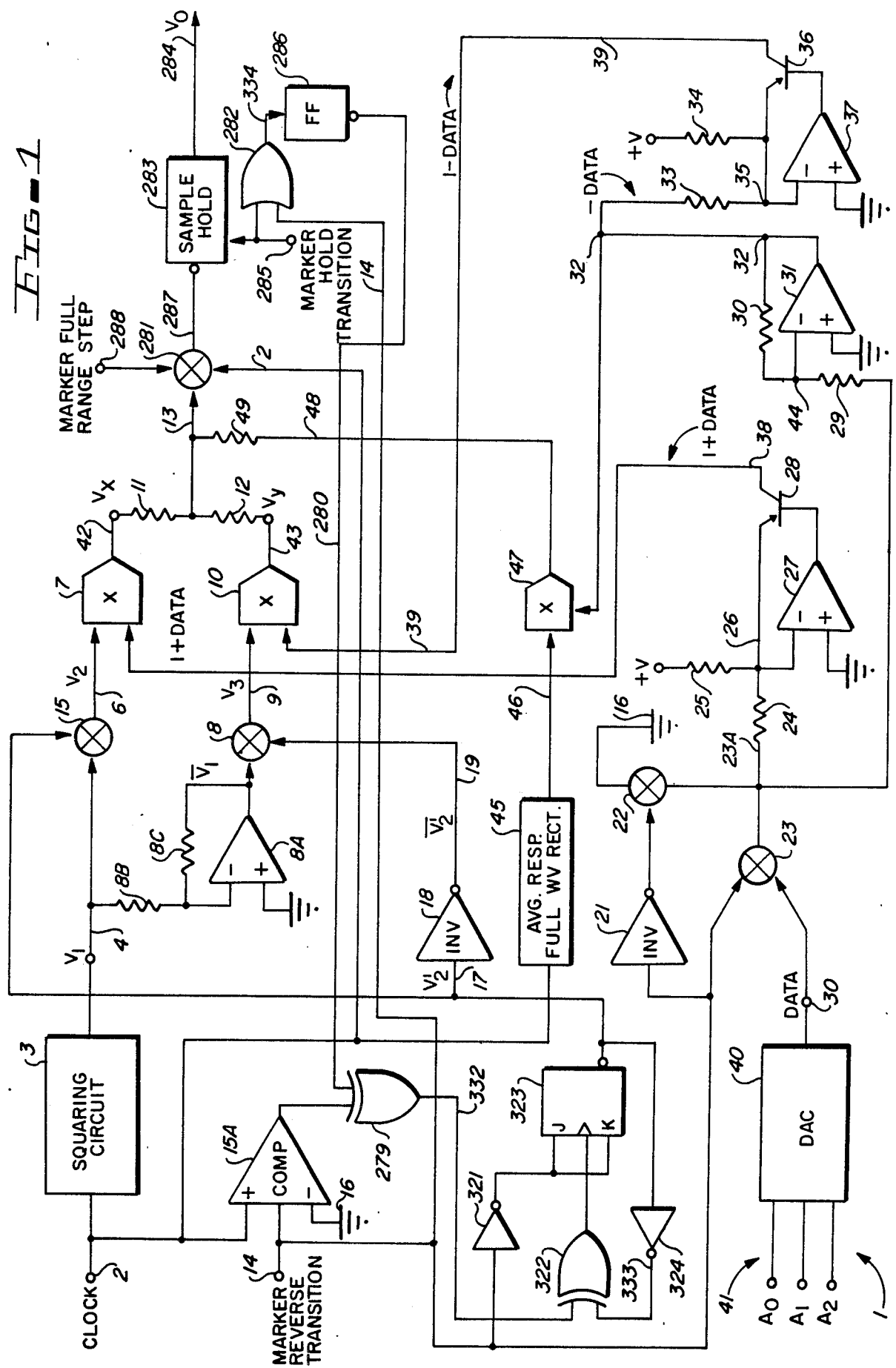
FIG. 1 is a schematic diagram of an encoding or modulating circuit in one embodiment of the invention.
Figure 2:
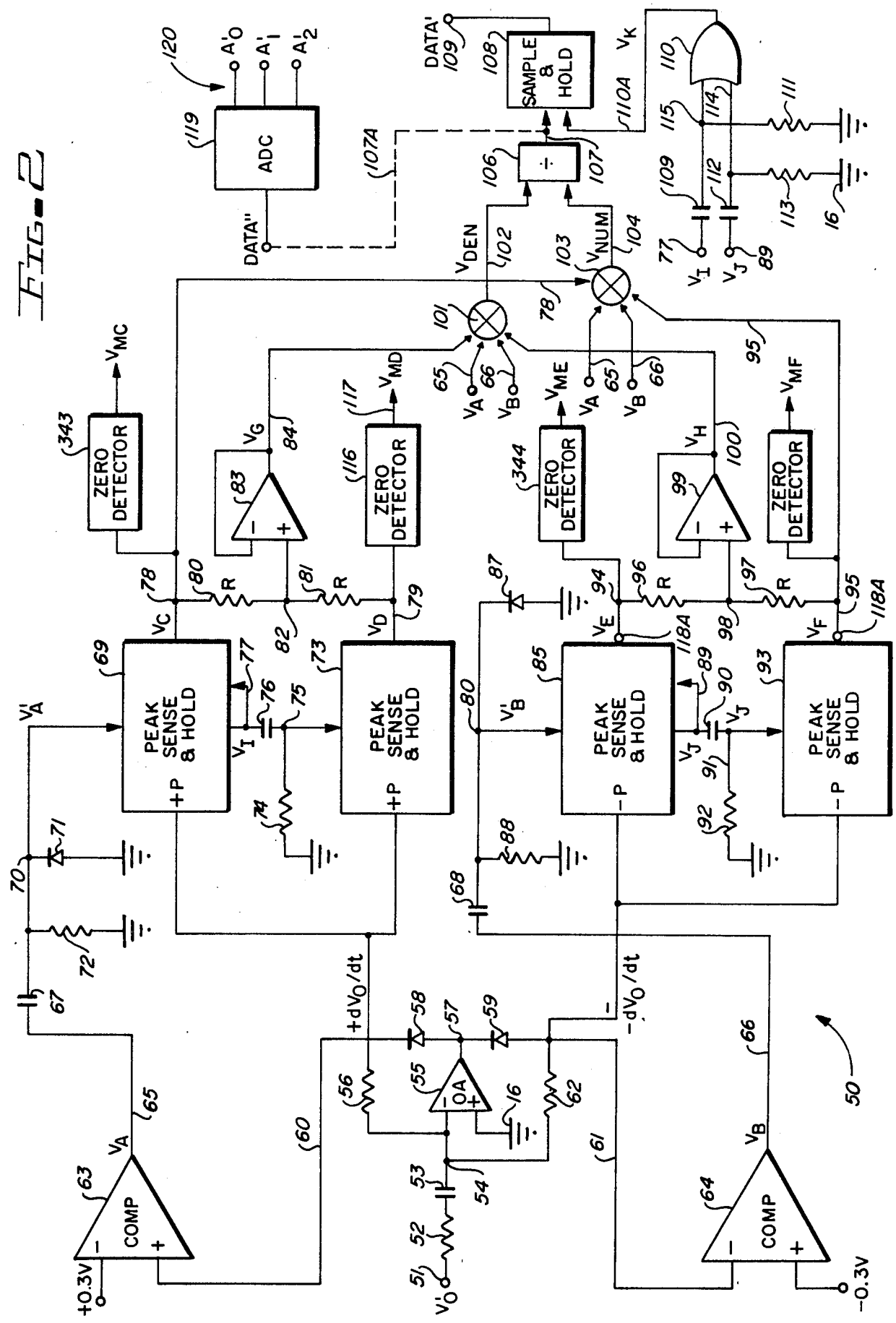
FIG. 2 is a schematic diagram of a demodulator circuit in accordance with one embodiment of the present invention.
Figure 5:
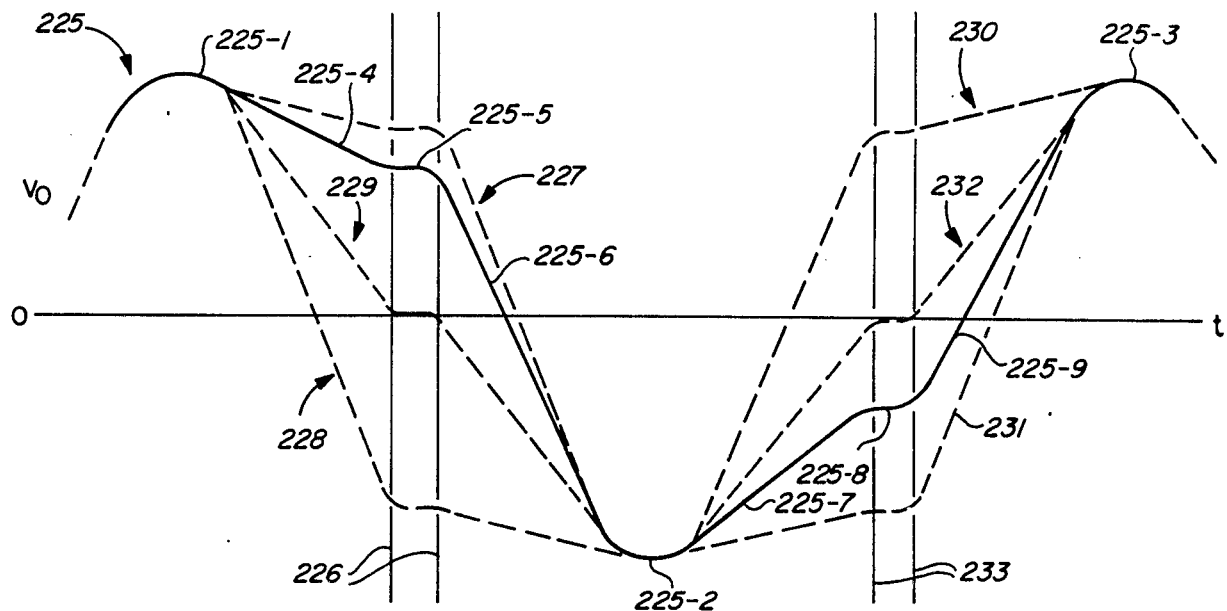
FIG. 5 is a diagram of several cycles of a modulated carrier signal of the present invention.

Before describing in detail the structure and operation of the encoder or modulator circuit of FIG. 1 and decoder or demodulator circuit 50 of FIG. 2, it may be helpful to first describe in detail the modulated carrier waveform $V_0$ that is the output produced by encoder circuit 1; after this modulated carrier waveform $V_0$ has been transmitted through a communications channel, it is received and demodulated by the demodulator circuit 50 of FIG. 2. Referring now to FIG. 5, reference numeral 225 designates the waveform $V_0$ shown. It includes a positive peak 225-1, a negative peak 225-2, and a positive peak 225-3, representing one cycle of the initial modulated carrier signal from which the $V_0$ waveform is produced in accordance with the invention.

There is a negative going transition between peaks 225-1 and 225-2 including an upper slope 225-4, an intermediate almost level slope 225-2, and a steep negative slope 225-6. Between peaks 225-2 and 225-3, there is a positive going transition including slope 225-7, an almost level intermediate slope 225-8, and a much steeper slope 225-9.

The intermediate levels 225-2 and 225-8 are referred to herein as "AUDEL levels".

The above mentioned downward transition can have any of an infinite number of AUDEL levels, all of which fall between the two vertical lines 226. For example, if the intermediate AUDEL level of the downward transition lies at approximately zero volts, then dotted line 229 designates the location of the downward transition, and the slope of both the upper portion and the lower portion of the transition will be equal. Dotted line 227 designates an approximate upper limit to the values of the downward transition between peaks 225-1 and 225-2 and dotted line 228 indicates approximately a lower practical limit of the downward transition between those two peaks of waveform 225. Similarly, dotted lines 230 and 231 designate upper and lower practical limits of the upward transition between peaks 225-2 and 225-3. Reference numeral 232 designates a special situation of interest in which the AUDEL level is approximately zero.

Subsequently, it will be apparent that the special cases indicated by dotted lines 229 and 232 indicate a zero level modulation.

Referring now to FIG. 1, analog encoder circuit 1 has three inputs, namely a clock signal input 2, a marker input 14, and a DATA input 30. The clock signal is the waveform 125 shown in FIG. 3, and the DATA input is an analog signal level which can have any value within the range from roughly 10% to 90% of the range between the positive and negative power supply levels. (For other possible implementations, this range could be different.) In one embodiment of the invention, data conductor 30 can be the output of a digital-to-analog converter 40 having digital inputs 41. If the number of above-described AUDEL levels is $2^N$, the number of digital inputs 41 is N bits.

Figure 3:
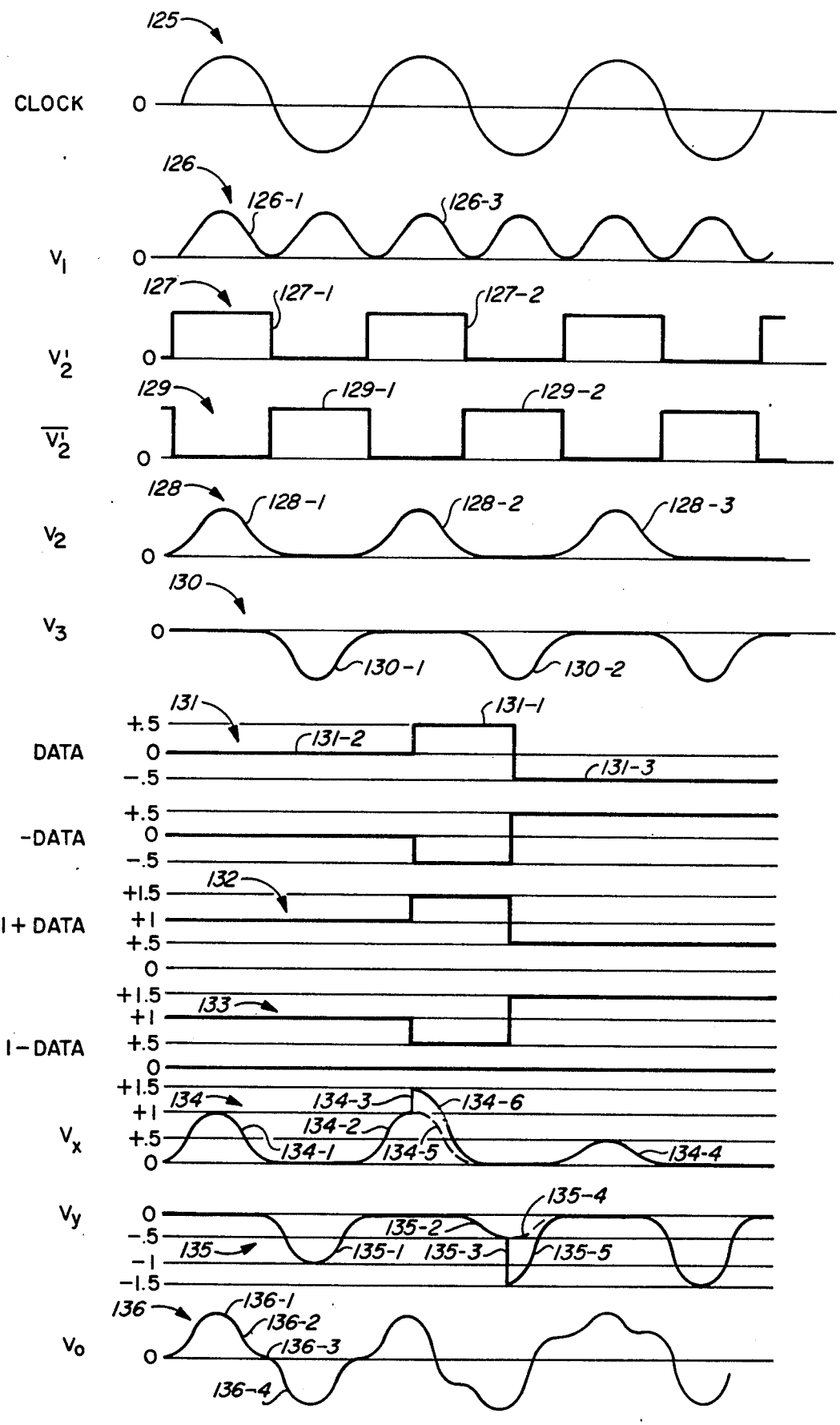
FIG. 3 is a diagram showing waveforms that are useful in explaining the operation of the modulator circuit of FIG. 1.

The output of analog encoder 1 is an "AUDEL-modulated" signal having the form of the signal $V_0$ shown in FIG. 5; this signal $V_0$ is produced on conductor 284, and corresponds to waveform 136 of FIG. 3.

In FIG. 1, CLOCK input 2 is connected to the input of squaring circuit 3 and a comparator 15A. Squaring circuit, which performs the function of doubling the frequency of the CLOCK signal, 3 can be implemented in various ways, for example, by connecting CLOCK signal conductor 2 to both inputs of an analog multiplier. A suitable analog multiplier would be a MPY 100A, manufactured by Burr-Brown Corporation. Comparator 15A can be an LM361 manufactured by National Semiconductor. The output of squaring circuit 3 is a voltage V1, which is applied to conductor 4. Conductor 4 is connected to one terminal of analog switch 15. Conductor 4 also is connected by resistor 8B to the negative input of operational amplifier 8A, the positive input of which is connected to ground. The output of operational amplifier 8A is coupled by resistor 8C (which is equal to resistor 8B) to the negative input of operational amplifier 8A. This circuit inverts the signal V1 on conductor 4 and applies it to an input of analog switch 8. Switches 8 and 15 can be ordinary analog switches, such as a IH5027s, manufactured by Intersil. The control electrode of analog switch 15 is connected to conductor 17. Conductor 17 is connected to the Q* output of JK flip flop 323, which can be an LS112. The J and K inputs at flip flop 323 are connected to the output of inverter 321, the input of which is connected to conductor 14. The CLOCK input of flip flop 323 is connected to the output of exclusive OR gate 322, one input of which is connected by conductor 332 to the output of exclusive OR gate 279, and the other input of which is connected by conductor 333 to the output of inverter 324. The input of inverter 324 is connected to conductor 17. The output of inverter 18 is a voltage V'2* which is applied to conductor 19. Conductor 19 is connected to the control input of analog switch 8. Except when a frame marker is being produced, the output of comparator 15A and exclusive OR gate 279 is a voltage V'2, so it can be seen that the signals applied to the control inputs of analog switches 8 and 15 are logical complements. The other input of exclusive OR gate 279 is connected by conductor 280 to the output of a toggle flip flop 286. The output of toggle flip flop 286 is connected by OR gate 282 to a "hold transition" marker control input on conductor 285, which input is connected to activate sample and hold circuit 283, which can be an LF398 manufactured by National Semiconductor Corporation. Sample and hold circuit 283 has its input connected by conductor 287 to the output of a single pole double throw analog swtich 281, which can be an IH5143, manufactured by Intersil. One analog input of switch 281 is connected to CLOCK conductor 2, and the other is connected to $V_0$ conductor 13. The control input of switch 281 is connected to "Full Range Step" marker control conductor 288, which is used to cause a "Full Range Step" frame marker to be produced on $V_0$ conductor 284, as subsequently described.

The negative input of comparator 15A is connected to ground conductor 16, and the positive input of comparator 15 is connected to CLOCK conductor 2. A "Reverse Transition" frame marker input can be applied to conductor 14 which is used to produce a "Reverse Transition" type of frame marker, as subsequently explained. Conductor 14 is connected to the other input of OR gate 282, the output of which is connected to the toggle input of toggle flip flop 286 by means of conductor 334.

The second terminal of analog switch 15 is connected to conductor 6, on which a voltage $V_2$ is produced. Conductor 6 is connected to one input of analog multiplier 7. The output of analog multiplier 7 is connected to conductor 42, on which a voltage $V_X$ is produced. Similarly, the second main terminal of analog switch 8 is connected to by means of conductor 9 to one input of analog multiplier 10. The output of analog multiplier 10 is a voltage $V_Y$ which is produced on conductor 43. The voltages $V_X$ and $V_Y$ are summed across resistors 11 and 12 to output conductor 13, on which the AUDEL modulated waveform $V_0$ on conductor 284 appears if there is no frame marker present. Analog multipliers 7 and 10 can each be implemented by means of CA3080 integrated circuit two quadrant analog multipliers manufactured by RCA.

The second input of analog multiplier 7 connected to conductor 38. The second conductor of analog multiplier 10 is connected to conductor 39. A signal called "1+DATA" is applied to conductor 38, and a signal "1−DATA" is applied to conductor 39.

The signal DATA applied to input 30 of FIG. 1 which is connected to one input of an analog switch 23, the control input of which is connected to rever transition frame marker conductor 14. The other main terminal of analog switch 23 is connected to conductor 23A, which is coupled by means of resistor 24 to the negative input of operational amplifier 27. The positive input of operational amplifier 27 is connected to ground conductor 16. The negative input of operational amplifier 27 is also connected to conductor 26, which is connected to the emitter of a PNP transistor 28, the base of which is connected to the output of operational amplifier 27. Conductor 26 is connected by means of resistor 25 to a +V supply voltage conductor. The collector of transistor 28 is connected to conductor 38.

Conductor 23A is also connected to one terminal of an analog switch 22, the other main terminal of which is connected to ground conductor 16. The control input of analog switch 22 is connected to the output of inverter 21, the input of which is connected to conductor 14. Analog switches 22 and 23 can be analog switches, such as an IH5027 manufactured by Intersil. Operational amplifier 27 can be an LF411 manufactured by National Semiconductor.

Conductor 23A is coupled by means of resistor 29 to the negative input of operational amplifier 31, the positive input of which is connected to ground conductor 16. The negative input of operational amplifier 31 is also connected to one terminal of resistor 30A, the other terminal of which is connected to conductor 32. Conductor 32 is connected to the output of operational amplifier 31. A signal "−DATA" is produced on conductor 32. Conductor 32 is coupled by means of resistor 33 to the negative of input of operational amplifier 37, the positive input of which is connected to ground conductor 16. The negative input of operational amplifier 37 is also connected to emitter of PNP transistor 36, the base of which is connected to the output of operational amplifier 37. The collector of transistor 36 is connected to conductor 39. The emitter of transistor 36, namely conductor 35 is coupled by means of resistor 34 to the +V supply conductor.

Node 13, on which the signal $V_0$ is produced if no frame marker is present, is also connected by resistor 49 to the output 48 of another analog multipliers 47, which can be identical to analog multiplier 7 and 10. One input of analog multiplier 47 is connected to conductor 46, which is also connected to the output of a rectifier circuit 45. The input of rectifier circuit 45 is connected to CLOCK conductor 2, Those skilled in the art can provide a wide variety of full wave rectifier circuits (including average response full wave rectifier circuits) which rectify the sinusoidal signal CLOCK. The other input of analog multiplier 47 is connected to conductor 32 on which the signal −DATA is produced.

Referring now to FIG. 2, the input to analog AUDEL modulation decoder 50 is a voltage V'0 applied to conductor 51. This waveform can be identical to or a replica of the $V_0$ waveform designated by reference numeral 206 in FIG. 4. The output of the AUDEL modulation encoder is either the analog output DATA' on conductor 109 or the corresponding digital output of analog to digital converter 119 on terminals 120, i.e., the three digital bits A'0, A'1 and A'2, the logical state of which should be identical to bits A0, A1, and A2 of FIG. 1.

V'0 conductor 51 is coupled by series connected resistor 52 and capacitor 53 to conductor 54. Conductor 54 is connected to the negative input of operational amplifier 55. Operational amplifier 55 can be an LF411, manufactured by National Semiconductor. Its positive input is connected to ground conductor 16. Its output is connected to conductor 57. Conductor 57 is connected to the anode of diode 58 and cathode of diode 59. The anode of diode 59 is connected by resistor 62 to conductor 54. The cathode of diode 58 is connected to conductor 60, which is connected by resistor 56 to conductor 54. Operational amplifier 55, diodes 58 and 59, resistor 56 and 62, capacitor 53 and resistor 52 form a differentiating circuit.

Figure 4:
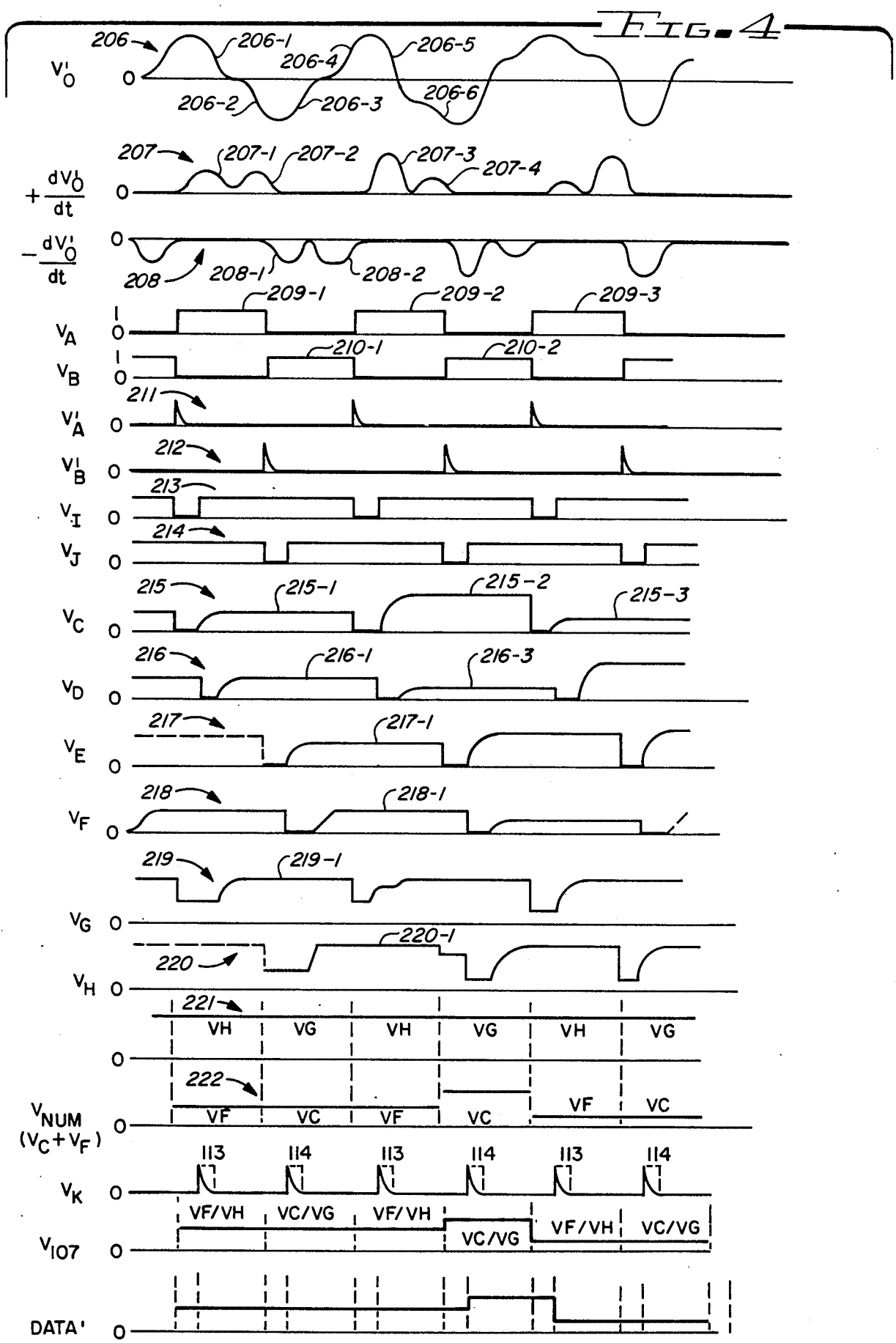
FIG. 4 includes waveforms of a timing diagram that are useful in explaining the operation of a demodulator circuit of FIG. 2.

A voltage $dV'_0/dt$ is produced on conductor 60, and is designated by reference numeral 207 in FIG. 4. A signal $-dV'_0/dt$ is produced on conductor 61, which is connected to the anode of diode 59. The $-dV'_0/dt$ signal is shown in waveform 208 of FIG. 4.

Conductor 60 is connected to the +P inputs of peak sense and hold circuits 69 and 73. Conductor 61 is connected to the −P inputs of peak sense and hold circuits 85 and 93.

These circuits can be PKD-01's, manufactured by Precision Monolithics.

Conductor 60 is also connected to the positive input of comparator 63, the negative input of which is connected to +0.3 volts. The output of comparator 63 produces a logitical signal $V_A$ on conductor 65, which is coupled by capacitor 67 to conductor 70. Conductor 70 is connected to the reset input of peak sense and hold circuit 69. Resistor 72 is connected between conductor 70 and ground conductor 16. The cathode of diode 71 is connected to conductor 70, and the anode of diode 71 is connected to ground conductor 16. A signal $V_{A'}$ is produced on conductor 70. Conductor 61 is, in similar fashion, connected to comparator 64, which produces $V_A$ on conductor 66 and, by the action of comparator 68 and resistor 88, produces the differential signal $V_{B'}$ oon conductor 80.

Peak sense and hold circuit 69 produces an "acquire" signal $V_I$ on conductor 77, which is fed back into a internal gating circuit that "holds" or stores the sampled peak voltage received on conductor 60. Conductor 77 is also coupled by capacitor 70 to conductor 75. Conductor 75 is connected to the reset input of peak sense and hold circuit 73, which is identical to peak sense and hold circuit 69. Conductor 75 is also connected by resistor 74 to ground conductor 16.

The output of peak sense and hold circuit 69 is a voltage $V_C$ produced on conductor 78. Conductor 78 is connected by resistor 80 to conductor 82, which is connected to the positive input of operational amplifier 83. The negative input of operational amplifier 83 is connected to conductor 84, which is also connected to the output of operational amplifier 83. A voltage $V_G$ is produced by operational amplifier 83 on conductor 84, which is equal to the voltage of conductor 82. Conductor 82 is connected by resistor 81 to conductor 79, which is connected to the output of peak sense and hold circuit 73. A zero detecting circuit 343 (an LM361) has its input connected to conductor 78, and produces an output signal $V_{MC}$.

Peak sense and hold circuit 73 produces a voltage $V_D$ on conductor 79. Conductor 79 is also connected to the input of a zero detecting circuit 116, which can be an LM361 comparator manufactured by National Semiconductor. The output of zero detecting circuit 116 is a voltage $V_{MD}$ on conductor 117, indicating the presence of a "marker" signal, subsequently described.

Conductor 84 is connected to one terminal of an analog switch 101. The two control inputs of analog switch 101 are connected to conductors 65 and 66, respectively. The output of analog switch 101 is connected to conductor 102, on which a voltage $V_{DEN}$ is produced.

An output voltage $V_E$ is produced on an inverting output of negative peak sense and hold circuit 85, on conductor 94. Conductor 94 is connected by resistor 96 to conductor 98, which is connected to the positive input of operational amplifier 99. Negative peak sense and hold circuit 93 produces an output $V_F$ on an inverting output 118A that is connected to conductor 95. Conductor 95 is connected by resistor 97 to conductor 98, and is also connected to an input of analog switch 103. Conductors 94 and 95 are connected to inputs of zero detecting circuits 344 and 345, which produce the signals $V_{ME}$ and $V_{MF}$, respectively. As subsequently explained, these signals are used to determine which of the possible frame markers, if any, is present.

The negative input of operational amplifier 99 is connected to its output 100, on which it produces a voltage $V_H$. Conductor 100 is connected to an input of analog switch 101.

Conductor 78 is connected to another terminal of analog switch 103. $V_A$ conductor 65 and $V_B$ conductor 66 are connected to respective control inputs of analog switch 103, which produces a voltage $V_{NUM}$ on conductor 104.

Conductors 102 and 104 are connected to inputs of an analog divider circuit 106, which produces a signal on conductor 107 representing the ratio of the voltages $V_{NUM}$ (numerator) and $V_{DEM}$ (denominator). This voltage is applied to the sample input of a sample and hold circuit 108. The output of sample and hold circuit 108 is connected to conductor 109, on which the analog signal DATA' is produced. The DATA" signal on conductor 107 can alternatively be to the analog input of analog-to-digital converter 119 as indicated by dotted line 107A, which produces a digital representation of DATA' on outputs 120.

An enable input of sample and hold circuit 108 is connected by conductor 110A to the output of an OR gate 110. One input of OR gate 110 is connected to conductor 115, which is coupled by resistor 111 to ground conductor 16 and by capacitor 109 to conductor 77, on which the signal $V_I$ is produced, as previously explained. Similarly, the other input of OR gate 110 is connected to conductor 112. Conductor 112 is coupled by resistor 113 to ground conductor 16 and by capacitor 112 to conductor 89, on which $V_J$ is produced.

Comparators 63 and 64 are ordinary integrated circuit comparators, such as an LM361, manufactured by National Semiconductor. Operational amplifiers 83 and 99 can be LF411 integrated circuit operational amplifiers manufactured by National Semiconductor. Analog divider circuit 106 can be an MPY100A manufactured by Burr-Brown Corporation. Sample and hold circuit 108 can be an LF398 manufactured by National Semiconductor Corp. Analog to digital converter 119 can be any commercially available analog to digital converter. Analog switches 101 and 103 can be ADG200CJ switches, manufactured by Analog Devices, Inc.

Now that the structure of the modulator circuit 1 of FIG. 1 and the demodulator circuit 50 of FIG. 2 have been described, the operation of these two circuits will be described with reference to the timing diagrams of FIGS. 3 and 4, respectively. Referring first to FIGS. 1 and 3, waveform 125 is the CLOCK input applied to terminal 2 of FIG. 1. It is a sinusoidal carrier signal, and is mathematically squared by squaring circuit 3 to produce the voltage $V_1$ on conductor 4. The $V_1$ waveform is designated by reference numeral 126 in FIG. 3, and is applied to an input of analog switch 15, and is inverted by the circuit including operational amplifier 8A, resistor 8B, and resistor 8C. The inverted voltage V1 is applied to an input of analog switch 8.

The odd numbered half cycle portions of V1 are gated through analog switch 15 by the clock signal V2', designated by reference numeral 127 in FIG. 3 to produce the $V_2$ waveform on conductor 6 of FIG. 1. More specifically, peaks 127-1 and 127-2 of the $V'_2$ waveform gate half cycles 126-1 and 126-3 of the $V_1$ waveform onto conductor 6, thereby producing peaks 128-1 and 128-2 of the $V_2$ waveform. (For convenience, positive or negative half cycles of the sinusoidal waveforms are referred to as "peaks"). Similarly, the peaks 129-1 and 129-2 of the $V'_2$ waveform on conductor 19 gate the even numbered peaks of the V1 waveform (not shown) onto conductor 9, to produce peaks 130-1 and 130-2 of the $V_3$ waveform.

It should be appreciated that up to now, no modulation of the carrier signal 125 has yet occurred. Such modulation is accomplished in response to the analog signal level DATA appearing on data conductor 30. In FIG. 3, waveform 131 designates some sample values of the signal DATA. It can be seen that the waveform DATA changes from a first level 131-2 of zero volts to a second level 131-1 of +0.5 volts at the peak of one of the positive half cycles of the CLOCK signal and then undergoes a transition to −0.5 volts, as indicated by 131-3 at the negative peak of the following half cycle of the CLOCK signal. Those skilled in the art can readily provide circuits which would either produce the signal DATA on conductor 30 by some means other than the illustrated digital to analog converter 40, or strobe digital to analog converter 40 so as to produce the data changes at peaks or valleys of the signal CLOCK. For example, generation of the desired "window" or "frame" for DATA can be achieved by differenting the signal CLOCK, fitting the result into a window comparator circuit, and then operating a sample and hold circuit which "frames" the asynchronous analog data, if that is what is applied to conductor 30. In such a scheme, one comparator of the window comparator circuit would switch slightly before the zero crossing of the derivative signal, and the other comparator would switch slightly after the derivative zero crossing point. The two resulting signals would be logically ORed together to get narrow pulses that occur at the positive and negative peaks of the signal CLOCK. Then, a sample and hold circuit could be used to hold a particular value of the signal DATA between two such peaks. If a digital to analog converter is used to produce DATA, as shown in FIG. 1, then it can be strobed with such a signal in synchronization with the positive and negative peaks of CLOCK.

The circuitry including analog switches 22 and 23, and operational amplifiers 27, 31 and 37 and transistors 28 and 36 produces the signals 1+DATA and 1−DATA on conductors 38 and 39, respectively. These two signals are designated generally by reference numerals 132 and 133, respectively, in FIG. 3. DATA waveform 131 can be a DC level or a time varying signal, depending upon what is driving terminal 30, and can be handled as described above. If terminal 30 is driven by a digital-to-analog converter 40, then, if there are three digital inputs 41 which are converted to eight discrete analog levels, there will be eight discrete levels produced by the AUDEL modulation and "encoded" onto the output signal $V_0$. In general, if there are N digital bits, which are converted to analog levels, there will be $2^N$ levels representing all possible combinations of the N digital bits. This is another way of stating that each half cycle of an AUDEL modulated carrier signal $V_0$ which has the $2^N$ discrete AUDEL levels contains, in encoded form, N digital bits.

The analog level of the signal DATA on conductor 30 is normally gated through analog switch 23 onto conductor 23A. Normally, analog switch 22 is off, except when the Reverse Transition marker signal on conductor 14 is true in order to produce a "frame marker", as subsequently explained. The data level on conductor 23A is summed with an "analog 1" or a constant "1" level produced by the voltage +V at the upper terminal of resistor 25. Thus, the signals 1+DATA are summed on node 26. Operational amplifier 27 properly biases PNP transistor 28, which reproduces the signal 1+DATA on conductor 38. Similarly, inverting circuit 31 and equal resistors 29 and 30 invert the DATA signal on conductor 23A. Thus, the signal −DATA appears on conductor 32 and is summed with the constant "1" level represented by the +V voltage on the upper terminal of resistor 34. The current in conductor 35 represents the signal 1−DATA, which is reproduced on conductor 39 by PNP transistor 36, which is driven by operational amplifier 37.

Thus, it is seen that the sum of the "gains" of analog multipliers 7 and 10 is 2.0 (note that 1+DATA+1−DATA=2). This constant gain ensures that the outputs of the two analog multipliers $V_X$ and $V_Y$, when summed by resistors 11 and 12, produces a signal on conductor 13 with an essentially constant peak-to-peak voltage, as long as changes in DATA are only permitted at peaks or valleys of the CLOCK or carrier signal 125. (If DATA changes during positive going or negative going transition of CLOCK signal 125, then the peak-to-peak amplitude will not be constant). The instantaneous voltage levels of the "positive" or half cycles of the $V_2$ waveform are thus multiplied by 1+DATA to produce $V_X$, thereby modulating the slopes of the half cycles of the $V_2$ waveform. Similarly, the slopes of the negative half cycles of the $V_3$ waveform are multiplied by the quantity 1−DATA. However, one skilled in the art will be able to readily recognize that the peak-to-peak amplitude of the sum of $V_X$ and $V_Y$ is constant.

Thus, the $V_X$ waveform, generally designated by reference numeral 134 in FIG. 3, is obtained simply by multiplying the peaks of the $V_2$ waveform 128 by the 1+DATA waveform designated by reference numeral 132, and the peaks of the $V_Y$ waveform 135 are obtained by multiplying the peaks of the $V_3$ by the value of the 1−DATA waveform 133. Simple summing of the $V_X$ and $V_Y$ gives the $V_0$ output waveform designated by reference numeral 136.

For example, peak 128-1 of $V_2$ is multiplied by +1.0, the level of the 1+DATA signal, to produce peak 134-1 of the $V_X$ waveform. Then, peak 130-1 of $V_3$ is multiplied by +1.0, the present value of 1−DATA, to produce pulse 135-1 of the $V_Y$ waveform. Next, the first half of peak 128-2 of the $V_2$ waveform is multiplied by +1.0, but the second half of peak 128-2 is multiplied by +1.5 volts, since 1+DATA changes from +1.0 to +1.5 in the middle of peak 128-2. This produces peak 134-2 of the $V_X$ waveform. The step in the value of 1+DATA produces the step 134-3 of peak 134-2. Next, the first half of peak 130-2 of $V_3$ is multiplied by +0.5, but the second half of peak 130-2 is multiplied by +1.5, since 1−DATA changes from +0.5 to +1.5 during the middle of peak 130-2 of the $V_3$. This produces peak 135-2 of the $V_Y$ waveform and the one volt step in 1−DATA produces the step 135-3 of the peak 135-2. Next, peak 128-3 of $V_2$ is multiplied by +0.5, the present value of 1+DATA, to produce peak 134-4 of the $V_X$ waveform.

Simple resistive summing of $V_X$ and $V_Y$ would produce the algebraic sums of the $V_X$ and $V_Y$ waveforms on conductor 13, and the two steps or "glitches" 134-3 and 135-3 would be present. All of the intermediate "AUDEL levels" would occur at zero volts. This approach would work fine, and the demodulator circuit 50 would accurately demodulate the information, since it operates on the principle of taking the ratios of slopes of the AUDEL modulated waveform $V_0$ and is insensitive to the steps that would be caused by steps 134-3 and 135-3 of the $V_X$ and $V_Y$ waveforms. However, to produce a "cleaner" waveform, the discontinuities produced by changes in DATA can be corrected for by resistively summing such corrections into node 13, as is accomplished by the circuit, including resistor 49, analog multiplier 47 and rectifier 45.

What that is done, the amount of correction resistively summed into conductor 13 of FIG. 1 through resistor 49 is represented by the "difference" between dotted line 134-5 and the solid line 134-6 for pulse 134-2. Similarly, the "difference" between dotted line 135-4 and solid line 135-5 of pulse 135-2 represents the amount of correction for the change in the value of DATA from +0.5 volts at level 131-1 to −0.5 volts indicated by level 131-3 of the DATA signal. With this correction being made, the waveform $V_0$ designated by reference numeral 136 appears without the above-mentioned glitches, as shown in FIG. 3.

One skilled in the art will readily be able to recognize that the amount of correction produced by analog multiplier 47 and resistor 49 needs to be dependent on the magnitude of CLOCK. In order to accomplish this, CLOCK is rectified by rectifier circuit 45, and its output is provided as a multiplier to the single −DATA on conductor 33A in order to produce the desired correction for the glitches 134-3 and 135-3 caused by abrupt changes in DATA.

Thus, it can be seen that the $V_0$ signal, referred to herein as an AUDEL modulated carrier signal, has a peak 136-1 followed by a downward transition, including a relatively steep slope 136-2, followed by a relatively level downward slope 136-3, hereinafter referred to as an AUDEL level, which in turn is followed by another relatively steep downward slope 136-4. In this case, the slopes 136-2 and 136-4 are equal, and the intermediate AUDEL level 136-3 is midway between the maximum and minimum peaks of the transitions consisting of the slopes 136-2 and 136-4.

Referring now to FIGS. 2 and 4, the operation of the demodulator circuit 50 will be described. In FIG. 2, the $V'_0$ waveform designated by reference numeral 206 in FIG. 4 is a replica of the AUDEL modulated carrier signal $V_0$ produced on conductor 13 on the encoder circuit 1 of FIG. 1. Typically, encoder circuit 1 is located on the transmitting end of a communications channel and the demodulator circuit 50 is located on the opposite end. Typically, the $V_0$ waveform 136 produced by encoder circuit 1 will be subjected to some attenuation and distortion during transmission through the communications channel to produce the signal $V'_0$. The $V'_0$ signal is input to the differentiating circuit including operational amplifier 55, resistors 52, 56, and 62, capacitor 53 and diodes 58 and 59.

This circuit produces the $+dV'_0/dT$ waveform 207 in FIG. 4. It includes two peaks or pulses 207-1 and 207-2. 207-1 is the derivative, i.e., slope of peak 206-1 of the $V'_0$ waveform. The second peak 207-2 is the slope of the lower portion 206-2 of the $V'_0$ waveform. Since both slopes 206-1 and 206-2 are equal, the amplitudes of the derivative peaks 207-1 and 207-2 are the same. The next peak 207-3 of derivative waveform 207 represents the slope 206-5 of $V'_0$. Since this slope is much steeper than the amplitude of the lower slope 206-6, the amplitude of peak 207-3 is much higher than the amplitude of peak 207-4. Similarly, the last two peaks of derivative waveform 207 have different amplitudes that reflect the steepness of the two subsequent slopes of waveform 206.

Similarly, the $-dV'_0/dT$ waveform generally designated by reference numeral 208 includes negative peaks or pulses, the amplitudes of which represent the slopes of the positive going transitions of $V'_0$. More specifically, the amplitude of peak 208-1 represents the slope 206-3, and the amplitude of derivative peak 208-2 represents the slope 206-4. Similarly, the other peak of derivative waveform 208 represent the corresponding leading and trailing slopes of the subsequent transitions of $V'_0$.

The $+dV'_0/dT$ waveform 207 is applied to the positive input of comparator 63, thereby producing the timing signal $V_A$, which represents the crossover points of the derivative of $V'_0$. This is another way of saying that the rising and falling edges of $V_A$ occur at the maximum and minimum points $V'_0$. The waveform $V_B$ similarly has rising and falling edges that coincide with the maximum and minimum points of $V'_0$, and is the logical complement of $V_A$.

A differentiating circuit including capacitor 67 and resistor 72 differentiates $V_A$ to produce the waveform $V'_A$ designated by reference numeral 211. $V'_A$ is used to reset peak sense and hold circuit 69. The reason for differentiating it is to produce a narrow reset pulse so that if the first of a pair of peaks of $dV'_0/dT$ has less amplitude than the first peak of the previous pair, only the smaller amplitude of the first peak will be stored and reproduced on conductor 78 as $V_C$. Similarly, the differentiating circuit including capacitor 68 and resistor 88 differentiate the positive going edges of $V_B$ to produce the waveform $V'_B$ designated by reference numeral 212 to provide the narrow reset pulses to peak sense and hold circuit 85 for the same reason.

Peak sense and hold circuit 69 generates an "acquire" signal $V_I$ on conductor 77 when the first peak of a pair of derivative peaks of the $dV'_0/dT$ waveform reaches its maximum value and stores that amplitude on an internal capacitor in the "hold" circuitry portion of peak sense and hold circuit 69. The $V_I$ pulse is used to reset the second peak sense and hold circuit 73, which then senses and stores the amplitude of the second peak of the pair of peaks corresponding to a particular negative transition of $V'_0$.

In FIG. 4, the waveform $V_C$ appearing on conductor 78 and represents the sensed amplitude of each initial pulse of each pair of peaks of $dV'_0/dT$ waveform 207 is designated by numeral 215. The waveform $V_D$ on conductor 79 represents the sampled amplitude of the second peak of that pair of peaks of the $dV'_0/dT$ waveform is designated by reference numeral 216. For example, pulse 215-1 represents the sensed and stored amplitude of peak 207-1 of derivative waveform 207. Pulse 216-1 of $V_D$ represents the amplitude of the second peak 207-2 of derivative waveform 207. Pulse 215-2 of $V_C$ is the sampled and stored amplitude of peak 207-3 of derivative waveform 207, and pulse 216-3 of $V_0$ is the amplitude of peak 207-4 of derivative waveform 207.

Similarly, the signal $V_E$ represented by reference 217 and the signal $V_F$ designated by reference numeral 218 produced by peak sense and hold circuits 85 and 93, respectively, represent the amplitudes of the peaks of the $-dV'_0/dT$ waveform 208. For example, pulse 217-1 of $V_E$ has the amplitude of peak 208-1 of derivative waveform 208, and pulse 218-1 of $V_F$ has the amplitude of peak 208-2 of derivative waveform 208, and so forth.

At this point, for each positive going or negative going transition of $V'_0$, the corresponding values of the waveforms $V_C$, $V_D$, $V_E$, and $V_F$ contain all of the analog signal levels necessary to reproduce the levels of the signal DATA on conductor 30 of FIG. 1 that were originally used to modulate the carrier signal CLOCK of FIG. 3 in order to produce $V_0$, and hence, the $V'_0$ waveforms in the first place. These levels must be gated to the inputs of analog divider circuit 106 at the appropriate times. This is accomplished by means of the $V_A$ waveform applied to the control conductors of analog switches 101 and 103, and the $V_B$ waveform applied to the control conductors of analog switches 101 and 103. Note that the $V_A$ waveform is high during negative going transitions of $V'_0$ and the $V_B$ waveform is high during positive going transitions of $V'_0$. Analog switch 101 gates $V_G$ which is the sum of $V_C$ and $V_D$, to the $V_{DEN}$ input conductor 102 of analog divider 106 during the $V_B$ pulses, and gates $V_H$, which is the sum of $V_E$ and $V_F$, to $V_{DEN}$ conductor 102, during the $V_A$ pulses. The summing of $V_C$ and $V_D$ occurs by virtue of resistors 80 and 81, which have the same value R. Analog switch 103 gates $V_C$ to the $V_{NUM}$ input 104 of analog divider 106 during the $V_B$ pulses and gates $V_F$ to the $V_{NUM}$ conductor 104 during the $V_A$ pulses.

For example, negative-going transitions 206-1 and 206-2 of $V'_0$ result in derivative peaks 207-1 and 207-2. The amplitudes that these are sensed to produce pulses 215-1 of $V_C$ and 216-1 of $V_D$. Similarly, positive-going transitions 206-3 and 206-4 result in pulses 217-1 of $V_E$ and 218-1 of $V_F$. Negative-going transition slopes 206-5 and 206-6 of $V'_0$ result in pulses 215-2 of $V_C$ and 216-3 of $V_D$. These pulses result in the corresponding portions of $V_G$ and $V_H$ as shown. During pulse 210-1 of $V_B$, the value of $V_G$ is that of pulse 219-1. Consequently, the level of pulse 219-1 is the value of $V_{DEN}$ during $V_B$ pulse 210-1, as indicated in FIG. 4. Also, during $V_B$ pulse 210-1, the value of $V_C$ pulse 215-1 is gated to conductor 104 by analog switch 103 to produce the value of $V_{NUM}$ during $V_B$ pulse 210-1. Similarly, during $V_A$ pulse 209-2, the amplitudes of derivative pulses 208-1 and 208-2 appear on $V_E$ pulse 217-1 and $V_F$ pulse 218-1, and the sum of these appears on $V_H$ pulse 220-1. Consequently, this level is gated by analog switch 101 onto $V_{DEN}$ conductor 102, and the value of $V_F$ of pulse 218-1 is shown on the $V_{NUM}$ waveform in FIG. 4. By now, it can be seen that unless the peak-to-peak amplitude of the $V'_0$ waveform changes, the value of $V_{DEN}$ will remain constant.

Similarly, the amplitudes of derivative peaks 207-3 and 207-4 result in the amplitudes of $V_C$ pulse 215-2 and $V_D$ pulse 216-3, respectively. This results in an increase in the value of $V_{NUM}$ during $V_B$ pulse 210-2, as shown.

The unclocked signal $DATA''=V_{107}$ on conductor 107, the output of analog divider 106, is simply the ratios of the various values of $V_{DEN}$ and $V_{NUM}$ during the three above-mentioned time frames, i.e., the time frames defined by pulses 209-1, 210-1, 209-2, 210-2, etc.

The $V_{107}$ waveform in FIG. 4 indicates these ratios. $V_{107}$ looks just like $V_{NUM}$, as long as $V_{DEM}$ is constant. (Note that if the peak-to-peak amplitude of $V'_0$ changes, both $V_{NUM}$ and $V_{DEM}$ changes accordingly, but their ratio remains constant, and representative of the value of DATA, and the voltage on conductor 107 remains unchanged.)

Finally, the waveform $V_K$ which is produced by differentiating the rising edges of $V_I$ and $V_J$ and logically ORing them by means of OR gate 110 of FIG. 2, is used to strobe sample and hold circuit 108. This expedient is convenient to eliminate "glitches" that appear during switching of the various values of $V_D$ through $V_H$ by analog switches 102 and 103. The result is the signal DATA' on conductor 109, as shown in FIG. 4.

If it is desired to use analog-to-digital converter 119 to recover the digital state represented by the value of DATA", or actually the value of $V_{107}$, sample and hold circuit 108 can be omitted, and instead, the $V_K$ signal on conductor 110A can be connected to the analog input of analog-to-digital converter 119, as indicated by dotted line 107A.

It should be noted that a self calibration characteristic, which is inherent in the peak-to-peak amplitude of a particular transition of the modulated carrier signal is very important because it permits accurate recovery of the data represented by the particular mid-range ratios being used irrespective of any amplitude modulation that may exist on the AUDEL modulated carrier signal in addition to the AUDEL modulation. The other important self calibration characteristic is peak position in the time domain. "Peak occurence" detection of the carrier signal enables recovery of AUDEL modulating data irrespective of extraneous frequency or phase modulation in the carrier.

Nevertheless, it is important to realize that peak-to-peak amplitude detection and/or "sum of slopes" measurement and calibration is not essential to successful implementation of the present invention. For example, the ratio of the first slope of each transition to the successive slope of that transition could be taken, or the ratio of the intermediate level measured from the bottom peak of the transition to the difference between the maximum level of the transition to the intermediate level could be used, rather than ratioing one of these quantities to the peak-to-peak amplitude of the transition.

Figure 6:
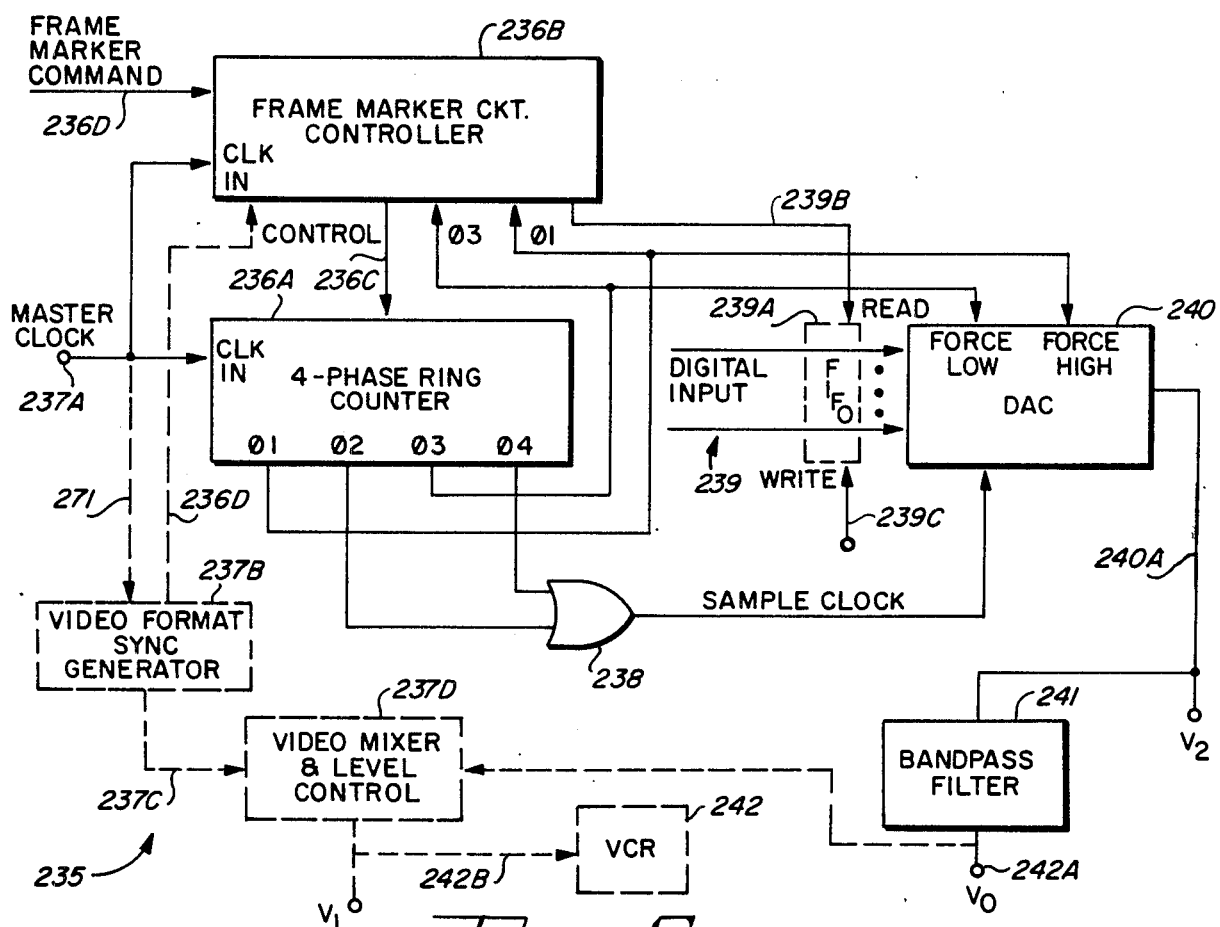
FIG. 6 is a diagram of a digitally implemented AUDEL modulator with a video format option.
Figure 7:
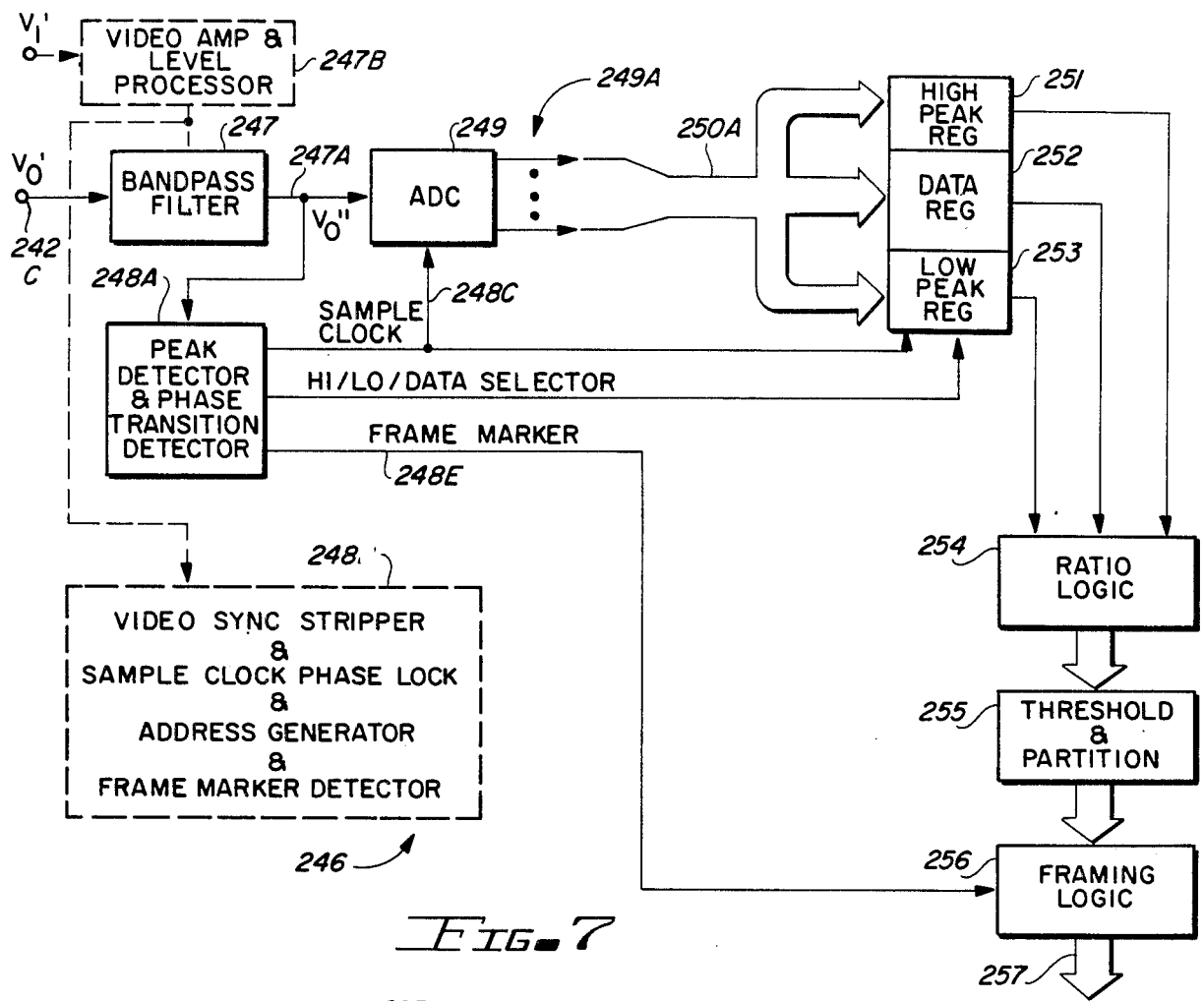
FIG. 7 is a diagram of a digitally implemented AUDEL demodulator with analog sample clock generators and video format option.
Figure 9:
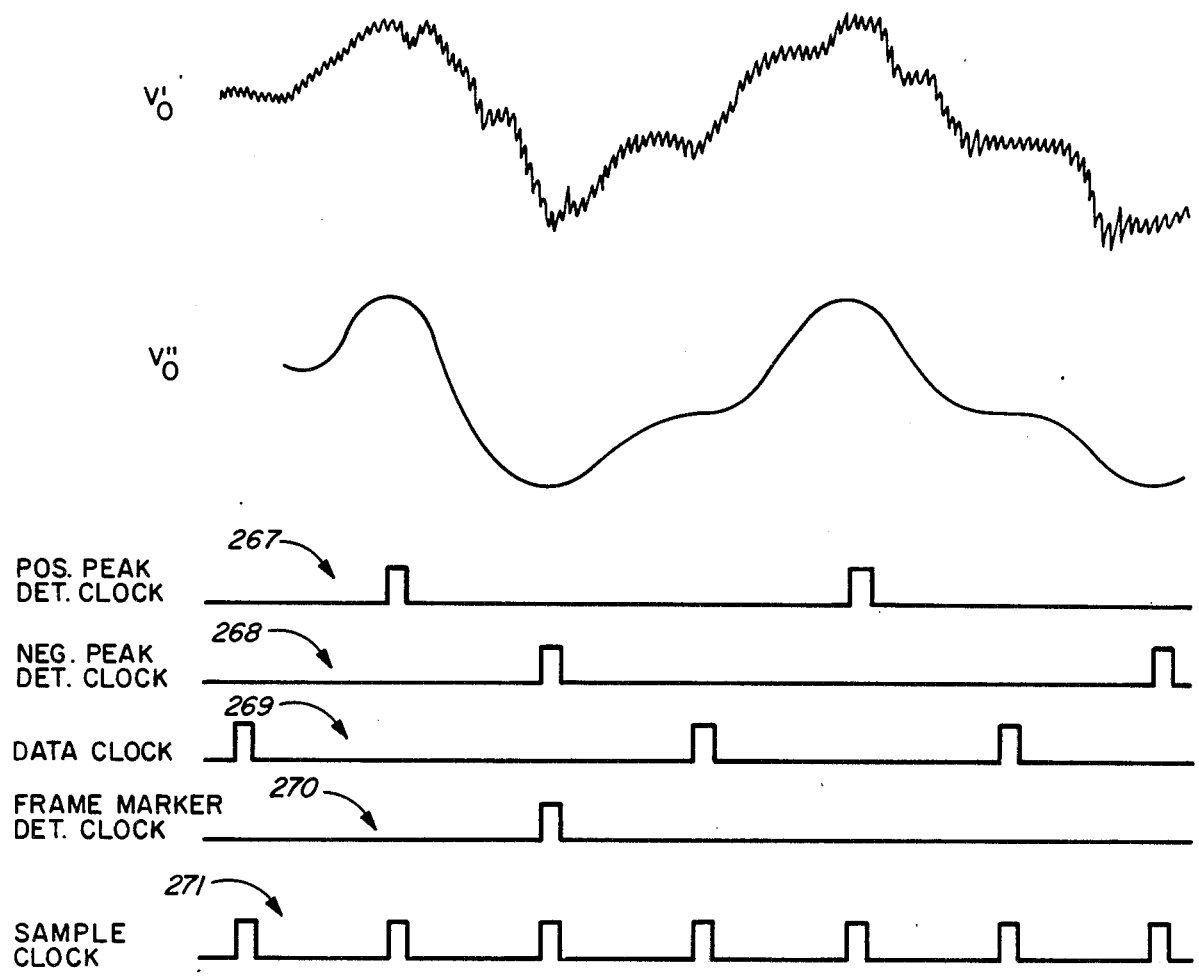
FIG. 9 is a timing diagram useful in explaining the demodulator of FIG. 7.

Next, an alternative embodiment of the invention will be described in which digital techniques are used both to generate an AUDEL modulated waveform that is somewhat similar to that shown in FIG. 5 and also a demodulator circuit for recovering the modulated signal produced by that modulated circuit. FIG. 6 shows the modulator or encoder circuit, and FIG. 7 shows the demodulator. FIGS. 8 and 9 constitute timing diagrams used in explaining the operation of the modulator and demodulator circuits, respectively. Referring now to FIG. 6, digital encoder or modulator circuit 235 includes three main components, including timing circuitry having a four phase ring counter 236A and a control circuit 236B which performs two functions. It alters the operation of four phase ring counter 236A to introduce frame markers, (i.e., AUDEL cycles with missing states 2 or 4 and it controls the flow of data out of FIFO (first in, first out) buffer 239A. Digital data 239 input to the modulator 235 enters the FIFO buffer asynchronously by external sample clock 239C.

Modulator circuit 235 includes a digital-to-analog converter 240 which receives digital inputs 239 out of FIFO buffer 239A that establish the intermediate levels on the modulated output waveform $V_0$. $V_0$ conductor 242A is the output of a band pass filter 241, which filters the output produced by digital to analog converter 240. OR gate 238 ORs the $\phi 2$ and $\phi 4$ signals produced by four phase ring counter 236A. Digital-to-analog converter 240 has a "force low" input which is connected to the $\phi 3$ conductor and a "force high" input, which is connected to the $\phi 1$ conductor. A logical "1" on the force low input forces the output conductor 240A of digital-to-analog converter to a minimum level, and a logical "1" on the "force high" input thereof forces the output 240A to a maximum level. A logical "0" on both of these inputs enables the digital to analog converter 240 to generate intermediate levels that represent modulation data. Alternatively, a modulator that operates within a video format to convey external clocking information requires additional logic circuitry, indicated by dotted lines. This can include a video format sync generator 237B comprising a counter and PROM, (programmable read only memory) which supplies master sync signals 236D to the frame marker controller 236B. Both circuits are clocked by master clock 237A, which is a harmonic of the basic video interval. Output 237C of the sync generator is combined with the AUDEL modulated waveform $V_0$ in conductor 242A through a video mixer and level control circuit 237D, wherein it becomes composite video signal V1, which is output to a communications or recording channel through conductor 242B. Frame marker controller 236B can be implemented by a simple circuit consisting mainly of readily available flip flops and gates, or a single field programmable logic sequencer like a SIG82S159. Four pulse ring controller 238A can be implemented by means of a 9319 decade sequencer manufactured by Fairchild, Inc. Digital to analog converter 241 can be a TDC1016J-8 manufactured by TRW, Inc. Analog bandpass filter 241 can be readily provided by one skilled in the art.

Still referring to FIG. 6, a video format can be inserted into or implemented by means of the digital modulator circuit of FIG. 6. In other words, the information or data stream can be imposed on a video format in the image video portion of the composite video signal. The dotted line signals in FIG. 6 indicate that this format is not part of the data stream, but is mixed with it by the video mixer 237D. A conventional first-in-first-out (FIFO) buffer 239A is necessary to maintain the steady rate digital data input 239 with the burst rate data output required by the video format. An adequate FIFO buffer is the MMI67401A by Monolithic Memories, Inc. Control of FIFO buffer 339A is through signals 239B emanating from sync generator 237B. A master clock is being used which is a harmonic of a video interval. There are two video intervals of greatest interest. One is the horizontal drive frequency and the other is the color burst frequency. They are harmonics of one another, but they are odd harmonics which are quite far apart. Either the color burst frequency or the horizontal drive frequency is used to generate the master clock. This is a signal designated by dotted line 271 in FIG. 6. The master sync signal 236D is produced by the video format sync generator 237B which can be an LM5321 by National Semiconductor. It enables frame marker controller 236B to control the flow of digital data out of FIFO buffer 239A by means of signal 239B, thus synchronizing the data frame to the video frame. Video sync signal 237C out of the video format sync generator 237B is mixed with the video synchronized data signal, which will be produced at the output of a bandpass filter designated by reference numeral 241. The bandpass filter serves to concentrate signal energy in the part of the frequency spectrum that is most efficient in downstream recorders, processors, or transmitters. Video mixer and level control 237D performs the mixing function in FIG. 6, and can be implemented mainly by means of a HI524 Video Multiplexor, manufactured by Harris Corporation. This results in a composite video signal on conductor 242B, designated by $V_1$. The composite video signal can be directly recorded on a video cassette recorder 242.

Referring now to FIG. 7, demodulator 246 receives a replica of $V_0$, namely, $V'_0$, at the far end of a communications or recording channel from conductor 242A of modulator circuit 235.

The $V'_0$ signal is applied to conductor 242C which is connected to the input of a band pass filter 247. This band pass filter removes multiplicative noise that may have been introduced by the transmission or recording medium. The output of analog band pass filter 247 is connected to the analog input of an analog-to-digital converter 249 and also to a circuit 248A which detects the peaks and phase transitions in the signal appearing on conductor 247A. The filter 247 can be readily provided by one skilled in the art.

Alternatively, demodulator 246 receives a replica of composite video signal $V_1$ at the far end of a communications or recording channel from conductor 242B of modulator circuit 235. This alternative is shown in dotted lines in FIG. 7. In the alternate embodiment, the $V_{1'}$ composite video signal enters through a conventional video amplifier and level processor 247B. The processed composite video output is connected to two circuits, the bandpass filter 247 and the sync stripper circuit 248B. In this example, clock information is derived from sync signals inherent in the video format, so peak detector 248A can be replaced by sync stripper, synchronous sample clock phase lock, address generator, frame marker detector circuit 248B. These circuits are conventional, and can be implemented by an RSS-101 (by Third Domain, Inc.), a TTLSWGM (by Engineered Components Company), a MMI74LS491, and SN74LS112 and SN74LS86 circuits, respectively.

Still referring to FIG. 7, in order to accomplish the video demodulation referred to above, the data $V_1$, which has come from conductor 242B of FIG. 6, is input in the form of voltage $V_{1'}$ to video amplifier and level processor circuit 247B. The output signal produced by video amplifier and level processor circuit 247B is provided as an input to bandpass filter 247 and also as an input to circuit 248B. This circuit is drawn in dotted lines to indicate that it is an alternative approach to performing the function of peak detector and phase transition detector circuit 248A in an alternative way. Circuit 248B performs the function of stripping the video sync, and performs a sample clock phase lock operation, meaning that the sample clock is locked to the video sync, and therefore, the samples will be made at the right time. Block 248B includes an address generator circuit that determines which datum occurring since the previous video sync is being dealt with, so that the data can be distinguished by unique addresses within each frame. Alternative circuit 248B also includes a frame marker detector circuit. The output of circuit 248B would be the same as the output of circuit 248A. It generates a hi/lo/data selector signal that selects between three things, namely, whether the output 249A is to be high peak, low peak, or mid-level data. Digital output from ADC 249 is clocked into the appropriate one of the high peak register 251, data register 252 or low peak register 253.

Circuit 248A produces a SAMPLE CLOCK signal on conductor 248C which is applied to the sampling input of analog-to-digital converter 249. Circuit 248A (or 248B) produces a high/low/data selector signal on one of three conductors 248D, which is applied to the conditional "clock enable" input of register 251, 252 or 253. Circuit 248A (or 248B) also produces a frame marker signal on conductor 248E, which is applied to the input of framing logic circuit 256. Circuit 248A consists mainly of peak sense and hold circuitry and zero crossing circuitry similar to that shown in FIG. 2, and can be easily provided by those skilled in the art.

The digital outputs of analog-to-digital converter 249 appear on conductors 249A, and are connected to the inputs of three conditional register circuits, including a high peak register 251, a data register 252, and a low peak register 253. The outputs of the three registers are connected to the inputs of a ratio logic circuit 254. The output of ratio logic circuit 254 is in the form of numbers representing digital ratios, as subsequently described, and are fed into the inputs of circuit 255, which performs "threshold and partition" functions, subsequently described. The outputs of circuit 255 are connected to the inputs of framing logic circuit 256. The output of circuit 256 provides the digital data which is output on conductors 257 to form a replica of the digital input applied to conductors 239 of modulator circuit 235 of FIG. 6.

The ratio logic indicated by reference numeral 254 in FIG. 7 could be easily implemented either by a digital Arithmetic Logic Unit circuitry or by a microprocessor. All it has to do is, for each half cycle of $V''_0$, the AUDEL carrier, (FIG. 9) to compute the raw digital ratio given by the expression $$(V_{DATA} - V_{LO\ PEAK})/(V_{HI\ PEAK} - V_{LO\ PEAK}),$$

where $V_{DATA}$ is the value of the AUDEL level.

The threshold and partition logic designated by reference numeral 255 again can be most conveniently implemented by means of a microprocessor algorithm which simply establishes, for example, M mutually exclusive partitions distinguished by a sequence of level ranges into which the number computed in block 254 will fall, and assigns a corresponding digital address number to each partition. The address field of M partitions is defined by log $2^{M=N}$ digital bits. For example, sixteen partitions may be distinguished by four bits since $2^4 = 16$.

This N-bit digital number (the partition address) would be output on conductors 257 unless, of course, the current half of the AUDEL carrier cycle represents a frame marker instead of an analog AUDEL level.

In FIG. 7 the threshold and digital comparison and partition circuitry 255A can be implemented by means of a programmable logic array or PROM. Any small microprocessor could be easily programmed to compute the ratio (INPUT-MIN)/(MAX-MIN). Conditional registers 251, 252 and 253 can be any of a wide variety of "clock enable" type registers like the AM29823 that is available from Advanced Micro Devices.

A digital division process performed by a microprocessor requires a digital division algorithm. Those skilled in the art can readily provide such division algorithms. This can be accomplished by means of a multiple subtraction loop wherein when the subtraction or accumulated results reach zero; the subtracting is stopped, and the number of times that the subtraction was performed is the quotient. A bit slice processor, such as the Advanced Micro Devices AM 2901C, can easily perform this function. Some commercially available arithmetic units can do this division directly on very large numbers within a single large scale integrated circuit.

The threshold and partition logic is essentially a set of digital comparators, or the AND array of a PROM. The function of the threshold digital comparison and partition circuit 255A is to partition "f(v)" (subsequently defined) into $2^N$ different bins. If there are N digital bits that were encoded within the signal that is being demodulated, then there are $2^{N=M}$ levels to be detected within each datum. Threshold digital comparison and partition logic 255A takes the results of the ratio logic circuitry 254, the output of which is $$(INPUT - MIN)/(MAX - MIN) = f(v),$$

which is a fraction of the maximum peak-to-peak signal, and assigns it to one of $2^N$ bins. Assignment of the bin address is to distinguish which of M digital levels is being recovered for the current transition of the AUDEL modulated signal. The N-bit address is the recovered N-bit datum.

It should be noted that the relationship between AUDEL level numbers and N-bit binary values is partly arbitrary. There is, for example, no necessity for lower levels to have lower binary values, the lower level could be mapped into the higher values. Nor is there a requirement that there be exactly $2^N$ AUDEL levels. That is simply the most efficient format. Nor is the relationship necessarily single, since rising pairs could be mapped one way and falling pairs mapped another way.

In FIG. 7, the framing logic 256 assigns to the datum a number within its time frame, i.e., a unique address. This enables the "downstream logic" (not shown) to assign to each datum a unique address corresponding to its time frame. Data at this point is in the format known as "bit parallel, byte serial". The N bits in parallel within each datum enable the datum to carry any one of $2^{N=M}$ values. Each datum is in a serial sequence with other data. If the sequence (i.e., the frame) contains $2^P$ data, then the datum sequence address will be P bits in length. For example, if an image raster is being read out, the circuit reads across the display screen, drops down a line, and reads across again. The P-bit address we are referring to distinguishes the different locations on the screen. The M-valued datum at each location corresponds to the brightness of the image of at the point.

The master clock input applied to conductor 237A of FIG. 6 is shown by the master clock waveform of FIG. 8A. The four outputs of four phase ring counter circuit 236A are shown by the $\phi 1$, $\phi 2$, $\phi 3$ and $\phi 4$ waveforms in FIG. 8A. The four waveforms $\phi 1$, $\phi 2$, $\phi 3$, $\phi 4$ simply provide four consecutive staggered pulses such as 258-1, 258-2, 258-3 and 258-4 during normal encoding or modulating of the carrier signal.

To generate a frame marker, the waveforms φ1, φ2, φ3, and φ4 are different than when the carrier is being modulated. If a frame marker is to be produced, the control signal on conductor 236C of FIG. 6 goes high during φ1, as indicated by reference numeral 259 and reference numeral 260 in FIG. 8B. This occurs when frame marker circuit 236B receives a frame marker command input on conductor 236D. The effect of the control signal pulse 259 being produced by frame marker circuit 236B during φ1 pulse 260 is to eliminate the next φ2 pulse. Thus, for the frame marker sequence, the φ2 waveform designated by reference numeral 261 in FIG. 8 does not have a pulse immediately following φ1 pulse 260, as shown, and instead is followed immediately by a φ3 pulse 262 and then by a φ4 pulse 263.

At this point, it is helpful to realize that pulses of the φ1 signal represent high peaks of the modulated output signal $V_0$. Pulses of the φ2 waveform correspond to negative going transitions of the $V_0$ signal. Pulses of φ3 correspond to low peaks of $V_0$, and pulses of φ4 correspond to positive going transitions of $V_0$.

In the example of FIG. 8B, wherein one frame marker is inserted in response to control signal 259, the digital inputs on conductors 239 of encoder circuit 235 result in one of the $2^N$ levels indicated by reference numerals 264-3 and 264-5 of the output of digital-to-analog converter 240, as indicated on the DAC output waveform in FIG. 8B.

During φ1 pulse 260, the force high input of digital-to-analog converter 240 causes the DAC output to be high, producing pulse 264-1. When φ3 pulse 262 then appears immediately after φ1 pulse 260, this causes the force low input of digital-to-analog converter 240 to force DAC output waveform to the low value indicated by 264-2, the transition being indicated by reference numeral 264-6. The absence of any of the intermediate levels, i.e., due to the omission of the φ2 pulse, is interpreted by the demodulator circuit of FIG. 7 as a frame marker.

The φ4 pulse 263 represents the digital to analog converter (DAC) output waveform 264 going from its low peak to an intermediate level, the voltage of which is determined by the digital inputs 239. The next φ1 pulse 260-1 then forces the DAC output waveform to the peak designated by reference numeral 264-4. The φ2 pulse 261-1 then produces the sample clock strobe signal at the output of OR gate 238 needed to produce the analog output level on conductor 240A corresponding to the present configuration of the digital inputs 239, namely one of the levels designated by reference numeral 264-5.

Finally, the band pass filter 241 filters the DAC output waveform to produce the signal designated by the modulated signal represented by reference numeral 265, which has substantially the same characteristics as the AUDEL modulator waveform mentioned previously herein. This AUDEL modulated waveform is then transmitted by a communications channel to input conductor 242C of the demodulator circuit of FIG. 7.

Band pass filter 241 has the characteristics that it includes the master clock frequency as a frequency near its upper limit and also includes the carrier frequency of the AUDEL modulator signal $V_0$ near its low cut off point. The master clock frequency is four times greater than the AUDEL carrier frequency.

A digital modulator could utilize a faster clock, more than four times the AUDEL carrier frequency, to create a digital approximation of sinusoidal pairs. Refer to FIGS. 8A and 8B for the following explanation. With a fast clock and a large scale integrated circuit of the programmable logic array type, it is possible to generate a DAC output that looks more like sinusoidal AUDEL waveform 265 than the digital AUDEL waveform 264.

Consider a sine function by degrees of its cycle from 0 to 360. At zero degrees, it has value zero. It rises to value +1 at 90 degrees, falls back to zero at 180 degrees, continues to fall to −1 at 270 degrees and rises back to value zero at 360 degrees, which becomes the starting point of the next cycle. Notice in FIG. 8B that the first half of the falling AUDEL pair between steps 1 and 2 is a sinusoidal half-cycle spanning 90 degrees to 270 degrees in waveform 265. The second half of the falling AUDEL pair, between steps 2 and 3 is also a sinusoidal half-cycle spanning the same 90 degree to 270 degree phases although it is displaced in overall level and its amplitude is the difference between the amplitude of the first half cycle and the amplitude of the carrier 265. In the rising AUDEL pairs, each half-cycle spans 270 to 90 degree phases. The amplitude value at each phase increment is determined at any given sample point by the sine of the phase at that point and the value of the datum in the current AUDEL pair. The full set of amplitude values can be programmed into a single integrated circuit component of programmable logic.

Note that the communications channel that has been referred to herein can also be an intermediate storage medium, for example, magnetic tape. See FIG. 11, subsequently described.

In FIG. 7, the digital circuitry downstream from the analog to digital converter 249 would most efficiently use an analog detector to generate its clocks. The clocks that are needed are a positive peak detector clock, such as the one designated by reference numeral 267 in FIG. 9, a negative peak detector clock such as the one designated by reference numeral 268 in FIG. 9, a 180° phase shift detector clock or data clock, such as the one designated by reference numeral 269 in FIG. 9, and a frame marker detector clock such as 270 in FIG. 9. These are the clocks that need to be produced by the analog peak detector and phase shift detector circuitry 248A in FIG. 7 or alternatively, by the composite video sync stripper circuit 248B. The sample clock 271 which is applied to conductors 248F and 248C, is the logical OR of clocks 267, 268, 269, and 270. The frame marker detector clock 270 is produced on conductor 248E, which is the control input to framing logic circuitry 256. Thus, analog to digital converter 249 produces an analog-to-digital conversion of the waveform $V''_0$ at every occurrence of a pulse of sample clock 271. The positive peak detector clock 267, the negative peak detector clock 268, and the 180° phase shift detector clock 269 are all input on three conductors, represented by reference numeral 248D, to the conditional registers "clock enable" inputs to determine which of registers 251, 252 and 253 will store present digital number from analog-to-ditigal converter 249 at the next clock edge. More specifically, positive peak detector clock 267 is the one that enables the digital data 249A to high peak register 251. Negative peak detector clock 268 is the one that enables the digital data 249A into low peak register 253, and phase shift clock 269 is the one which enables the digital data 249A into data register 252.

The three conditional registers 251, 252, and 253 can be conventional single value registers, with "clock enable" inputs like the SN74LS377, or The Am 29823.

The various analog devices that have been described above with reference to FIGS. 1 and 2 can be easily used to produce the five clock signals 267, 268, 269, 270 and 271, and the details will not be set forth as it would be obvious to those skilled in the art how these signals could be produced in a variety of different ways. Likewise, the digital video preprocessor 247B, the sync stripper, phase lock, address generator and frame mark detector logic of 248B are well known in the digital video field and are generally available in various large scale integrated circuits.

The sample clock defines the sample window of the data presently being converted by analog to digital converter 249. The other four clocks indicate the kind of data presently being converted, ie., whether it is the data of a positive or negative peak or a frame marker or an intermediate data level or AUDEL level.

Next, with regard to FIG. 12, the three basic kinds of frame markers that can be produced by the digitally-inplemented modulator circuit 235 of FIG. 6 are described. The first type of frame member is referred to as a "Full Range Step" frame marker, shown in waveform 301 of FIG. 12, that includes the digitally modulated carrier signal undergoing a "full" transition 300 from a maximum level MAX to a minimum level MIN. Another example of a "Full range Step" frame marker (not shown) would be a full transition from the level MIN to the level MAX with no intermediate level in the transition. This type of frame marker is easily achieved by the digital modulator circuit of FIG. 6, essentially in the manner previously described with reference to transition 264-6 in waveform 264 of FIG. 8B.

A second basic type of frame marker encoding, designated by reference numeral 302 in FIG. 12, shows the AUDEL modulated carrier signal undergoing a transition 303 from the level MAX to a level 304 halfway between MAX and MIN and then returning via transition 305 to the level MAX. This type of frame marker is referred to as a "Reverse Transition" frame marker. Another version of this type of reverse transition frame marker encoding is a transition from MIN up to the halfway level such as 304 and back to MIN.

The last type of frame marker is referred to as a "Hold Transition" frame marker, wherein the normal modulated carrier signal pattern is held at either MAX or at MIN for two clock periods. Waveform 306 of FIG. 12 shows an example of the former type, the "hold" level being designated by reference numeral 307.

These formats for encoding frame markers for the modulated carrier signal can be utilized to distinguish both frames and subframes of data strings. These frame markers can be recovered by detecting and discriminating deviations thereof from the normal AUDEL data sequence, as previously described with reference to block 256 of FIG. 7. The three types of frame marker encoding formats actually shown in FIG. 12 and their "complements" thus represent six different types of frame markers that can be used in conjunction with AUDEL modulated data in the waveforms $V_0$ and $V_0$' mentioned above.

Note that when the composite video format is used with AUDEL modulated data, the embedded horizontal and vertical sync signals can also serve as frame markers.

Next, the manner in which frame markers essentially equivalent to those described above are generated by "analog-implemented" modulator 1 of FIG. 1 will be described with reference to FIG. 13.

First, however, some features of FIG. 1 related to generation of frame markers will be noted. CLOCK conductor 2 is connected to one input of single pole double throw switch 281, which is also connected to conductor 13. Switch 281 selects either the $V_0$ voltage on conductor 13 or the CLOCK signal on conductor 2 and produces it on conductor 287, which is connected to an input of sample and hold circuit 283. A "Full Range Step" marker input is applied to conductor 288 to determine which of signal $V_0$ or CLOCK is multiplexed to conductor 287. Depending upon the timing, we can, during one transition, switch the signal CLOCK into the output stream on conductor 287 for either a rising or a falling Full Range Step marker. For a Hold Transition type of frame marker, sample and hold circuit 283 simply holds the maximum or minimum value on conductor 287, and otherwise, causes its output 284 to simply track with or follow the voltage on conductor 287. To produce a Reverse Transition type of frame marker, conductor 14 and the circuitry including exclusive OR gates 279 and 322, JK flip flop 323, inverters 321 and 324, OR gate 282, and toggle flip flop 286 are used.

FIG. 13 shows a number of waveforms which can be applied to frame marker control terminals 288 and 285 of FIG. 1 in order to cause analog modulator circuit 1 to produce the six different types of frame markers mentioned above. Waveform 125 in FIG. 13 is the CLOCK signal shown in FIG. 3. Waveform 136 is the $V_0$ waveform 136 in FIG. 3. Waveform 312 is the derivative of the clock signal, which can be produced with a simple differentiating circuit shown in FIG. 13A. The zero crossing points of waveform 312 are used to produce the waveform 313 in a conventional manner. The waveform $V'_2$ shown in waveform E is shifted 90° from waveform 313 and is identical to the $V'_2$ waveform 127 shown in FIG. 3. The first positive-going edge 313-1 on waveform 313 is the point at which an asynchronous marker signal at peak point 125-1 of CLOCK waveform 125 is set typically by setting an RS flip flop.

The transitions 313-1 and 313-2 are used to create the pulses 315 and 316, which can be applied to marker control conductor 14 to produce a reverse transition step frame marker signals. Similarly, waveform 316 can be easily generated and applied to marker control conductor 14 to produce a reverse transition frame marker signal of the type with an initial positive-going transition. Referring to FIG. 13, an also to FIG. 1, note that OR gate 282 in FIG. 1 logically ORs the hold transition marker input on conductor 285 and the reverse transition marker input on conductor 14 and applies the result to the toggle input of toggle flip flop 286, the inverted output of which is applied via conductor 280 to one input of exclusive OR gate 279. The output of exclusive OR gate 279 is applied by means of conductor 332 to control one of the inputs of exclusive OR gate 322. Exclusive OR gate 322, JK flip flop 323, and inverters 321 and 324 generate the signal $V'_2$ on conductor 17. $V'_2$ operates analog switches 15 and 8 to cause waveform 325 in FIG. 13 to not go through a phase reversal, but to instead rise to a maximum 325-1 and only at that point to begin a normal "data-containing" type of transition which, in this case, is a negative going transition designated by reference numeral 325-2. Note that the direction of transition 325-2 is opposite to the direction of the corresponding transition in $V_0$ waveform 136.

The generation of peak 325-1 of waveform 325 makes it necessary to achieve this reversal. The purpose of the circuit including exclusive OR gate 322, JK flip flop 323, and inverters 321 and 324 is to make this possible. The presence of two subsequent peaks of waveform 325, namely 325-3 and 325-1, is the characteristic feature of the type of reverse transition marker produced by the pulse 315 applied to conductor 14.

The production of an opposite polarity of reverse transition marker frame signal is indicated by reference numeral 327 in FIG. 13, in response to applying pulse 316 to conductor 14 a half carrier cycle time later than is the case to generate the above-described frame marker waveform 325 on the output $V_0$ on conductor 284 of FIG. 1. The dominant feature of the negative reverse transition frame marker waveform 327 is the consecutive appearance of negative peaks 327-1 and 327-2, instead of a normal continuation of the AUDEL modulation characteristic waveform after negative peak 327-1.

And in a similar fashion, waveforms 317 and 318 can be easily generated in response to waveforms 313 and 127 and applied to marker control conductor 288 to generate a Full Range Step frame marker signal of the type having a positive-going transition, or one having negative-going transition, respectively. The waveforms 317 and 318 are applied to conductor 288 of FIG. 1 simply operate analog switch 281 to switch the CLOCK signal on conductor 2 through the switch 281 onto conductor 287. Except when hold transition conductor 285 is activated, sample and hold circuit 283 applied the signal on conductor 287 onto $V_0$ conductor 287. Marker control pulse 317 of FIG. 13 produces the full range transition 337-1 on $V_{0M3}$ waveform 328 on conductor 284 of FIG. 1. Similarly, full range step marker pulse 318 of FIG. 13 is applied to conductor 288 and results in the $V_{0M4}$ waveform 329, with negative going full range transition 329-1 designating the frame marker. In each case, after the marker-representing transition 337-1 or 329-1 is complete, in a single half cycle of the clock signal 125, the next transition continues with normal AUDEL "data-containing" modulation.

For a "Hold Transition" type of frame marker signal, waveform 319 is applied to marker control conductor 285 to produce a frame marker of the type where the maximum value of $V_0$ is held on conductor 284 for at least one CLOCK cycle, or alternatively, waveform 320 is applied to marker control conductor 285 to cause the minimum value of $V_0$ to be held on conductor 284 for at least one CLOCK cycle.

Waveform 330 of FIG. 13 illustrates the $V_{0M5}$ frame marker pulse produced on conductor 284 of FIG. 1 in response to application of pulse 319 to hold transition frame marker conductor 285. The continued hold level 330-1 is the characteristic feature of $V_0$ that represents this type of frame marker. Finally, if pulse 320 of FIG. 13 is applied to conductor 285, then the resulting signal on conductor 284 of FIG. 1 is waveform 331, with its characteristic feature being the continued negative level 331-1.

Note that in FIG. 1, toggle flip flop 286 controls the exclusive OR gate 279, causing it to either act as an inverter or a noninverter. When the marker control signal applied to conductor 285 of sample and hold circuit 283 is exercised, then every time we change the state of the flip flop 286, this reverses the phasing so as to produce the level 330-1 on V0-M5 waveform 330 and level 331-1 on V0-M6 waveform 331.

The circuit of FIG. 14 is used to "decode" which of the six frame marker signals shown in FIG. 13 that is being presently output on $V_0$ 284 of FIG. 1, if any frame markers are indeed being presently output. The decoding circuit of FIG. 14 includes four inputs $V_{MC}$, $V_{MD}$, $V_{ME}$, $V_{MF}$ which are connected to the outputs of the zero detector circuits 343, 116, 344 and 345, respectively, in FIG. 2. The decoding circuit of FIG. 14 also includes two AND gates 341 and 338, two OR gates 339 and 342 and a D type flip flop 340. The output of AND gate 341 produces the signal $V_{CE}$ which is the logical AND of $V_{MC}$, and $V_{ME}$. The output of D type flip flop is a signal $V_{DF}$. The D input of D type flip flop 340 is connected to the $V_{MD}$ conductor. The clock input of D type flip flop 340 is connected to the output of OR gate 339. One input of OR gate 339 is connected to the $V_{MF}$ conductor, and the other input is connected to the output of AND gate 338, which has its inputs connected to the $V_{ME}$ conductor and $V_{MF}$ conductor. The output of OR gate 342, namely $V_{D+F}$, is the logical OR function of $V_{MD}$ and $V_{MF}$.

The logical variables $V_{ME}$, $V_{MF}$, and $V_{D+F}$ are input to a decoder 346, which implements the truth table shown in Table 1 to recover the frame marker control signals applied to conductors 14, 288, and 286 in FIG. 1 to produce the AUDEL modulated signal with frame markers included.

Decoder 346 can be easily implemented by one skilled in the art so the details are not shown. The entire circuit shown in FIG. 14 can be incorporated within a single LSI component like the PAL16RA from Monolithic Memories, Inc.

TABLE 1

| Prime Marker | $V_{CE}$ | $V_{DF}$ | $V_{D+F}$ |
|---|---|---|---|
| Reverse Transition ($V_{14+}$) | 1 | 1 | 0 |
| Reverse Transition ($V_{14-}$) | 1 | 0 | 0 |
| Full Range Step ($V_{288+}$) | 1 | 0 | 1 |
| Full Range Step ($V_{288-}$) | 1 | 1 | 1 |
| Hold Transition ($V_{285+}$) | 0 | 1 | 0 |
| Hold Transition ($V_{285-}$) | 0 | 0 | 0 |

Figure 10:
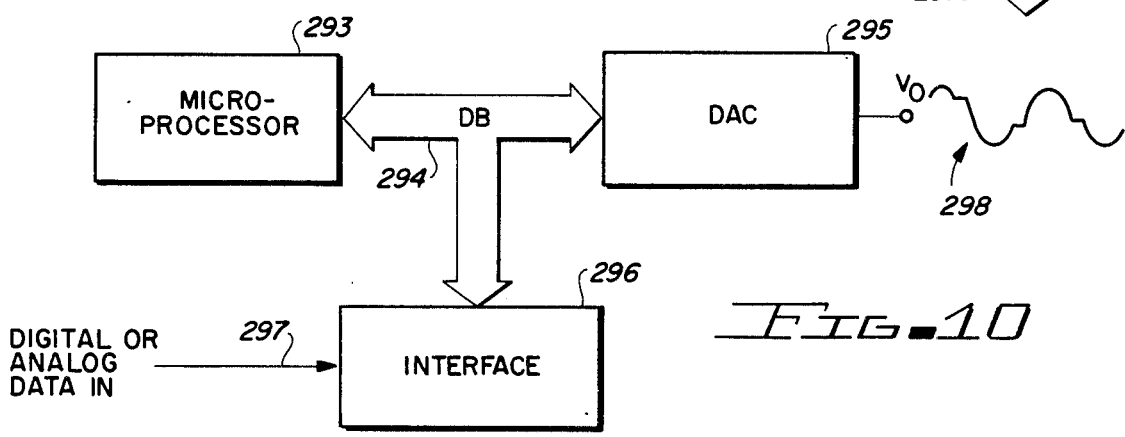
FIG. 10 is a diagram of a fully digital large scale integration approach to producing an AUDEL modulated carrier signal 9.

Referring now to FIG. 10, another digitally implemented embodiment of an encoder or "modulator" circuit which produces a signal having the form of an AUDEL modulated carrier signal includes a microprocessor 293 which is connected by means of a bus 294 to a digital to analog converter 295 and also to an interface circuit 296. A digital or analog input signal is applied to conductor or bus 297 in order to input the digital or analog data to be encoded into microprocessor 293. If the signal applied to conductor 297 is an analog signal, interface circuit 296 must include an analog-to-digital converter in circuits such as commonly available peripheral interface adaptors into which the resulting digital data is input and subsequently, read by microprocessor 293. If the data input on bus 297 is digital, then interface circuitry 296 merely needs to include peripheral interface adaptor circuitry or the like which is readily available to those skilled in the art from various semiconductor manufacturers. Microprocessor 293 operates in response to a simple program that sequentially generates digital versions of all of the points on all of the desired AUDEL modulated carrier signal, which is designated by reference numeral 298 in FIG. 10. These digital numbers are converted by digital-to-analog converter 295 into the waveform $V_0$, designated by reference numeral 298 in FIG. 10. A suitable filter that could be easily provided by one skilled in the art might be connected in series with the output of digital-to-analog converter 295.

Figure 11:
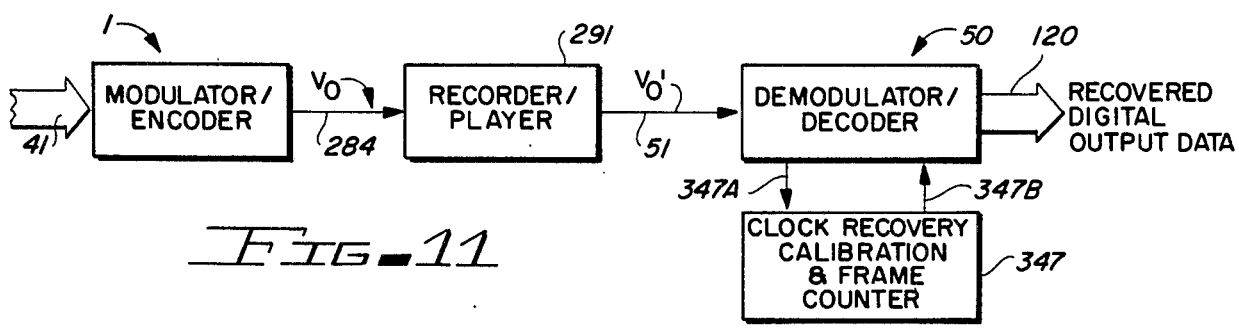
FIG. 11 is a diagram illustrating use of the encoding and demodulating system of the present invention in conjunction with storing large amounts of analog and-/or digital data on magnetic media.

FIG. 11 shows a basic block diagram of a system in which the encoder or modulator circuit of FIG. 1 is utilized in conjunction with demodulator 50 of FIG. 2 and a recorder/player device 291, such as a conventional video cassette recorder. The AUDEL modulated carrier signal $V_0$ produced on conductor 284 by modulator circuit 1 in response to digital input data 41 is provided as a recorded input to video cassette recorder 291. Latter, the recorded data stored on the magnetic tape in video cassette recorder 291 is played back to produce the signal $V_0'$, which is applied to conductor 51 of demodulator circuit 50, which reconstructs the data originally applied to data conductor 30 or digital input conductors 41 of the modulator circuit 1 (FIG. 1).

Typically, the recording of the AUDEL modulated waveform $V_0$ by means of video cassette recorder/player 291 and the playing of the recorded AUDEL modulated signal as "played back" will produce some distortion or shift in the signal $V'_0$ output on conductor 51. In order to compensate for this in demodulator circuit 50, a compensation circuit 347 is connected to demodulator circuit 50 by means of conductor 347-A and 347-B. Our experiments have shown that a DC shift may occur in $V'_0$ relative to $V_0$ as a result of the record/playback operation. The amount of shift necessary to be introduced in demodulator 50 can be determined by compensation circuit 347 in a variety of ways. One way is to use a certain frame marker to precede or identify calibration signals that are sent in the form of an AUDEL modulated waveform $V_0$ that has a known "calibration value", for example, 50% of the peak-to-peak value of the carrier signal, and represents a certain digital number. The resulting signal $V'_0$ actually received by demodulator 50 (after recording and playback on recorder/player 291) is then compared in compensation circuit 347 to a known reference level. The difference between the known reference level and the calibration value is equal to the amount of the DC shift that needs to be applied to each AUDEL level having "intended" level of that calibration signal. The same procedure can be repeated for other levels, for example 10%, 20%, 30%, 40%, 60%, 70% and 80% of the peak to peak carrier voltage. Once the proper calibration is established, then the appropriate voltage levels within demodulator 50 can be adjusted before the ratios are determined or, alternatively, digital techniques can be utilized to shift the digital output value to compensate for the shift produced by recorder/player 291.

Thus, it can be seen that the techniques for modulating a carrier signal embodied by the present invention have the advantage that extremely high density of digital information can be conveyed per cycle by the AUDEL modulated waveform and precisely recovered, despite considerable distortion or attenuation caused by the communications channel or intermediate recording media used, or despite variations due to amplitude modulation or changes in power supply voltage that may cause unintended variations in the peak to peak amplitude of the AUDEL modulated carrier signal output by the modulated circuit. The AUDEL modulated waveform has the characteristic that the modulation is "orthogonal" to other types of modulation, including amplitude modulation, frequency modulation and phase modulation, so that any of these could be independently applied to the same carrier signal to increase the amount of information conveyed per cycle of the carrier signal. The basic circuit techniques implemented and described herein can be accomplished at relatively low carrier frequencies or at extremely high carrier frequencies by using appropriate state of the art components. In any event, with an AUDEL modulated system the speed of data communication and relative cost per bit will be very low compared to systems using prior pulse coded modulation techniques. The described technique for introducing various frame markers gives a great deal of flexibility in communicating data.

While the invention has been described with reference to a number of particular embodiments thereof, those skilled in the art will be able to make various modifications to the disclosed embodiments of the invention, without departing from the true spirit and scope of the invention. It is intended that all equivalent elements and steps which perform substantially the same function in substantially the same way to obtain substantially the same result be encompassed within the present invention. For example, various kinds of ratios other than the ones described could be used to represent the data contained in each transition of the AUDEL modulated waveform. For example, the ratio of the first slope to the second slope of each transition could be used instead of the ratio of the first slope to the sum of the two slopes. Although FIG. 1 discloses use of analog multipliers to modify the first and second occurring slopes of each transition of the AUDEL modulated waveform, it would be possible to use other techniques for modifying these slopes, such as capacitively coupling first and second amounts of charge onto the conductor carrying the AUDEL modulated waveform at times corresponding to the first and second portions of that transition, respectively, wherein the ratio of the two amounts of charge could represent the modulation information or encoded information. Although sinusoidal carrier signals were disclosed in one embodiment of the invention, the carrier signal can be other than sinusoidal. For example, it could be generally triangular. In the sinusoidal embodiment of the invention described with reference to FIGS. 1 and 2, both the ratio of the slopes and the ratio of the intermediate AUDEL levels represent the same information. It is actually only necessary for one type of mid-range ratio to be carried by the transition modulated carrier signal, namely, either the ratio of the slopes or the ratio of the intermediate level-to-peak amplitude to the-peak-to peak amplitude of the particular transition under consideration. Other techniques for squaring the clock signal than the technique disclosed with reference to FIG. 1 could be used. Other types of modulation, such as amplitude modulation and/or frequency modulation and/or phase modulation could be simultaneously applied to each cycle of the AUDEL modulated carrier signal in order to increase the amount of information encoded and conveyed per cycle.

We claim:

1. A method of modulating a carrier signal, comprising the steps of:

(a) changing the slope of the first occurring one of the upper and lower portions of a first transition of said carrier signal to a first value in response to an input signal; and (b) changing the slope of the second occurring one of said upper and lower portions to a second value in response to said input signal, such that the ratio of one of said first and second values to the sum of said first and second values is representative of an input level of said input signal.

2. The method of claim 1 futher including demodulating said carrier signal by performing the steps of:

(1) producing a first derivative signal having a peak value representative of said slope of said first occurring one of said upper and lower portions of said first transition;

(2) producing a second derivative signal having a peak value representative of said slope of said second occurring one of said upper and lower portions of said first transition;

(3) producing a numerator signal representative of said peak value of a predetermined one of said first and second derivative signals and also producing a denominator signal representative of the sum of said peak values of said first and second derivative signals; and (4) dividing said numerator signal by said denominator signal to produce a first result signal level representative of said input level of said input signal.

3. The method of claim 2 including repeating steps (a) and (b) for a plurality of successive transitions of said carrier signal for differing values of said input level, respectively.

4. The method of claim 3 including, for each of said plurality of transitions, repeating steps (1) through (4) to produce a result signal level representative of the value of the input level corresponding to that transition.

5. The method of claim 4 wherein each of said input levels can have any of $2^N$ different values, corresponding to the $2^N$ possible combinations of N binary bits, each of said transitions have associated therewith a midrange ratio as recited in step (b) representing the states of N binary bits.

6. The method of claim 5 including producing each of said input signals by performing a digital-to-analog conversion of said N binary bits.

7. The method of claim 6 including performing an analog-to-digital conversion of each of said result signal levels to recover the values of said N binary bits corresponding thereto.

8. The method of claim 2 including squaring said carrier signal and then reversing the phase of odd numbered half cycles of the squared carrier signal, gating even numbered half cycles of said squared carrier signal to a first slope modulation circuit, and gating odd numbered half cycles of said squared carrier signal to a second slope modulation circuit.

9. The method of claim 8 wherein steps (a) and (b) includes varying the gains of said first and second slope modulation circuits in response to said input signal so that the sum of said gains remains equal to a predetermined constant for different values of said input level of said input signal.

10. The method of claim 9 including summing the output signals produced by said first and second slope modulation circuits to produce said result signal so that it has the form of a modulated output signal which has a plurality of transitions, each of which transitions includes a relatively steep leading portion, a relatively steep trailing portion, and a relatively level intermediate portion, the value of which intermediate portion represents a corresponding value of the input level of said input signal.

11. The method of claim 10 wherein the ratio of the slopes of the leading portion of each transition of said modulated output signal to the sum of the slopes of said leading and trailing portions is representative of the value of the input level of said input signal corresponding to that transition.

12. The method of claim 11 wherein said carrier signal is sinusoidal.

13. The method of claim 11 wherein steps (1) and (2) are performed by means of a differentiating circuit which produces said first and second derivative signals.

14. The method of claim 11 including sensing and storing said peak values of said first and second derivative signals by means of first and second peak sense and hold circuits, for each of said transitions of said carrier signal.

15. The method of claim 1 including determining said ratio of step (b) by means of an analog divider circuit.

16. The method of claim 10 including producing a correction signal in response to the amplitude of said carrier signal and the amplitude of a change in the value of said input signal and then summing said correction signal with said output signals produced by said first and second slope modulation circuits to correct for abrupt changes that would be otherwise produced in said modulated output signal in response to abrupt changes in the value of said first level of said first signal.

17. The method of claim 10 including the step of producing a frame marker in said modulated output signal by omitting said reversing of the phase of one of said odd numbered half cycles of said squared carrier signal.

18. The method of claim 4 including modulating said carrier signal to produce a full range step frame marker signal by performing the step of causing said carrier signal to undergo an entire second transition without substantially changing the slope of said carrier signal during said second transition.

19. The method of claim 1 wherein said carrier signals includes a frame marker, the method including detecting the presence of said frame marker on said carrier signal by detecting the absence of a derivative signal above a predetermined threshold level during a second occurring portion of said second transition.

20. The method of claim 4 including modulating said carrier signal to produce a reverse transition frame marker signal by performing the step of causing said carrier signal to undergo a transition from a positive or negative peak level to an intermediate level followed immediately by a transition back to that positive or negative peak level.

21. The method of claim 4 including modulating said carrier signal to produce a hold transition frame marker signal by performing the step of causing said carrier to hold a positive or negative peak level for at least ahalf cycle of said carrier signal.

22. The method of claim 1 wherein steps (a) and (b) are performed independently of the frequency of said carrier signal.

23. The method of claim 4 including further modulating said carrier signal by means of an amplitude modulation technique, a frequency modulation technique, and/or a phase modulation technique.

24. A system for communicating information by means of a carrier signal, said system including a modulation circuit, said system comprising:
  (a) means in said modulating circuit changing the slope of the first occurring one of the upper and lower portions of a first transition of said carrier signal to a first value in response to an input signal having an input level; and
  (b) means in said modulating circuit for changing the slope of the second occurring one of said upper and lower portions to a second value in response to said input signal at said input level, such that the ratio of one of said first and second values to the sum of said first and second values is representative of said input level of said input signal.

25. The method of claim 24 further including a demodulating circuit for demodulating said carrier signal, wherein said demodulating circuit includes:
  (1) means for producing a first derivative signal having a peak value representative of said slope of said first occurring one of said upper and lower portions of said first transition;
  (2) means for producing a second derivative signal having a peak value representative of said slope of said second occurring one of said upper and lower portions of said first transition;
  (3) means for producing a numerator signal representative of said peak value of a predetermined one of said first and second derivative signals and also producing a denominator signal representative of the sum of said peak values of said firt and second derivative signals; and
  (4) means for dividing said numerator signal by said denominator signal to produce a result signal level representative of said input level of said input signal.

26. The system of claim 25 wherein said input level can have $2^N$ different values, corresponding to the $2^N$ possible combinations of N binary bits.

27. The system of claim 26 including means for producing said input signal by performing a digital to analog conversion of said N binary bits.

28. The system of claim 4 including means for performing an analog-to-digital conversion of said result signal level to recover the values of the N binary bits corresponding thereto.

29. The system of claim 25 including means for squaring said carrier signal and means for reversing the phase of odd numbered half cycles of the squared carrier signal, means for gating even numbered half cycles of said squared carrier signal to a first slope modulation circuit, and means for and gating odd numbered half cycles of said squared carrier signal to a second slope modulation circuit.

30. The system of claim 29 including means for varying the gains of said first and second slope modulation circuits in response to said input signal so that the sum of said gains remains equal to a predetermined constant for different values of said input level of said input signal.

31. The system of claim 30 including means for summing the output signals produced by said first and second slope modulation circuits to produce said result signal so that it has the form of a modulated output signal which has a plurality of transitions, each of which transitions includes a relatively steep leading portion, a relatively steep trailing portion, and a relatively level intermediate portion, the value of which intermediate portion represents a corresponding value of the input level of said input signal.

32. The system of claim 31 wherein the ratio of the slopes of the leading portion of each transition of said modulated output signal to the sum of the slopes of said leading and trailing portions is representative of the value of the input level of said input signal corresponding to that transition.

33. The system of claim 32 wherein said carrier signal is sinusoidal.

34. The system of claim 32 wherein said first and second derivative signal producing means together include a differentiating circuit that differentiates the modulated carrier signal received by said modulating circuit to produce said first and second derivative signals.

35. The system of claim 32 including first and second peak sense and hold circuit means for sensing and storing said peak values of said first and second derivative signals.

36. The system of claim 34 wherein said dividing means includes an analog divider circuit.

37. The system of claim 31 including means for producing a correction signal in response to the amplitude of said carrier signal and in response to the amplitude of a change in the value of said input level of said input signal and then summing said correction signal with said output signals produced by said first and second slope modulation circuits to correct for abrupt changes that would be otherwise produced in said modulated output signal in response to abrupt changes in the value of said first level of said first signal.

38. The system of claim 37 wherein said correction signal producing means includes an analog multiple circuit responsive to said input level of said input signal and a rectifier circuit having an output coupled to an input of that analog multiplier, said rectifier circuit having an input coupled to said carrier signal.

39. The system of claim 26 including means for operating on said carrier signal to produce a full range step frame marker on said carrier signal by causing said carrier signal to undergo an entire second transition during a particular half cycle of said carrier signal without substantially changing the slope of said carrier signal during said second transition, either immediately before said first transition or immediately after said first transition or any other data-carrying transition of said carrier signal.

40. The system of claim 26 including means for operating on said carrier signal to produce a reverse transition frame marker on said carrier signal by causing said carrier signal to undergo a transition from a positive or negative peak level to an intermediate level followed immediately by a transition back to that positive or negative peak level during a particular half cycle of said carrier signal, either immediately before or immediately after any data-carrying transition of said carrier signal.

41. The system of claim 26 including means for operating on said carrier signal to produce a hold transition frame marker on said carrier signal by causing said carrier signal to hold a positive or negative peak level for at least a half cycle of said carrier signal, either immediately before or immediately after any data-carrying transistion of said carrier signal.

42. The method of claim 25 including means for detecting the presence of a frame marker on said carrier signal by detecting the absence of a derivative signal on said carrier signal and corresponding to said second derivative signal during a particular half cycle of said carrier signal.

43. A method of producing a first signal having the form of a modulated carrier signal, and of demodulating said first signal, said method comprising the steps of:
  (a) producing said first signal by
    i. producing a first portion of a first transition in the value of said first signal in response to an input signal having the first value and
    ii. producing a second portion of said first transition in response to said input signal at said first value, and causing said first and second portions to have first and second midrange characteristics associated respectively therewith, said first and second midrange characteristics being determined by said first value of said input signal so that a midrange ratio of a first quantity including the value of a predetermined one of said first and second midrange characteristics to a second quantity including the value of the other of said first and second midrange characteristics is respresentative of said first value of said input signal; and
  (b) demodulating said first signal by
    i. measuring said first midrange characteristics; and
    ii. measuring said second midrange characteristic;
    iii. dividing said predetermined one of said first and second midrange characteristics by the sum of said first and second midrange characteristics to produce a quantity or signal representative of said first value of said input signal.

44. The method of claim 43 including producing a frame marker signal in response to a frame marker control signal by causing said first signal to undergo a full range transition at the time of a second transition of said first signal instead of repeating steps (a) and (b) for said second transition.

45. The method of claim 43 including producing a frame marker signal in response to a frame marker control signal by causing said first signal to undergo a half range transition in a first direction.

46. The method of claim 43 including producing a frame marker in said first signal during a half cycle of said first signal in response to a frame marker control signal by causing a second transition of said carrier signal to have a value of one of the first and second midrange characteristics of said second transition to cause the midrange ratio of said second transition to have a value that cannot correspond to any allowed value of said input signal.

47. The method of claim 43 further including demodulating said first signal by performing the steps of:
  measuring said first midrange characteristic;
  measuring said second midrange characteristic;
  dividing said predetermined one of said first and second midrange characteristics by the sum of said first and second midrange characteristics to produce a quantity or signal representative of said first value of said input signal.

48. The method of claim 43 wherein steps (a) and (b) are both performed by means of a digital computer programmed to sequentially output digital numbers that represent successive levels of said first signal, sequentially applying those digital numbers to the inputs of a digital-to-analog converter, and producing said first signal in response to the analog output of said digital-to-analog converter.

49. A method of producing a first signal having the form of a modulated carrier signal, said method comprising the steps of:
  (a) producing a relatively steep leading portion of a first transition in the level of said first signal;
  (b) producing a relatively level intermediate portion in said first signal after said leading portion; and
  (c) producing a relatively steep trailing portion of said first transition after said relatively level portion, wherein the value of said first signal at said relatively level intermediate portion thereof is a predetermined proportion of the peak-to-peak amplitude of said first signal, said predetermined proportion representing a corresponding value of an input signal.

50. The method of claim 49 including repeating steps (a) through (c) for a plurality of successive transistions of said first signal for differing values of said input signal, the predetermined proportions of those transitions differing, respectively, in accordance with said differing values of said input signal.

51. The method of claim 50 including demodulating said first signal by performing the steps of:
  sensing the value of said first signal at the beginning of said first transition;
  sensing the value of said relatively level portion of said first transition;
  sensing the value of said first signal at the end of said first transition;
  determining the difference between said sensed values at the beginning and end of said first transistion to obtain the peak-to-peak amplitude of said first signal; and
  dividing the value of said relatively level portion by said peak-to-peak amplitude to obtain a value representative of said value of said input signal.

52. The method of claim 49 including performing step (b) by applying a digital representation of said value of said input signal to the digital inputs of a digital to analog converter to cause the output of said digital to analog converter to determine the value of said relatively level portion.

53. The method of claim 52 including performing step (a) by first applying a first predetermined signal to a force high input of said digital-to-analog converter, removing said first predetermined signal from said force high input, and then applying a second predetermined signal to a sample input of said digital-to-analog converter.

54. The method of claim 53 including performing step (c) by removing said second predetermined signal from said sample input and then applying a third predetermined signal to a force low input of said digital-to-analog converter.

55. The method of claim 54 including filtering the output signal produced by said analog-to-digital converter to produce said first signal.

56. A system for communicating information by means of a first signal having the form of a modulated carrier signal, said system including a modulating circuit, said system comprising:
  (a) means for producing a relatively steep leading portion of a first transition in the level of said first signal;
  (b) means for producing a relatively level portion in the level of said first signal after said leading portion; and (c) means for producing a relatively steep trailing portion of said first transition after said relatively level portion, wherein the value of said first signal at said relatively level portion thereof is a predetermined proportion of the peak-to-peak amplitude of said first signal, said predetermined proportion representing a corresponding value of an input signal.

57. The system of claim 56 including a demodulating circuit, wherein said demodulating circuit includes:
means for sampling the value of said first signal at the beginning of said first ransition;
means for sampling the value of said relatively level portion of said first transition;
means for sampling the value of said first signal at the end of said first transition;
means for determining the difference between said sampled values at the beginning and end of said first transition to obtain the peak-to-peak amplitude of said first signal; and
means for dividing the value of said relatively level portion by said peak-to-peak amplitude to obtain a value representative of said value of said input signal.

58. The system of claim 56 including a digital to analog converter and means for applying a digital representation of said value of said input signal to the digital inputs of said digital to analog conveerter to cause the output of said digital to analog converter to determine the value of said relatively level portion.

59. The system of claim 58 including means for applying a first predetermined signal to a force high input of said digital-to-analog converter, removing said first predetermined signal from said force high input, and means for then applying a second predetermined signal to a sample input of said digital-to-analog converter.

60. The system of claim 59 including means for removing said second predetermined signal from said sample input and then applying a third predetermined signal to a force low input of said digital-to-analog converter.

61. The method of claim 60 including means for filtering the output signal produced by said analog-to-digital converter to produce said first signal.

62. A method of producing a first signal having the form of a modulated carrier signal, said method comprising the steps of:
(a) producing a first portion of a first transition in said first signal, in response to an input signal having a first value, said first portion having a first slope; and (b) producing a second portion of said first transition in response to said input signal at said first value, said second portion having a second slope, said first and second slopes being determined by said first value of said input signal so that the ratio of said first slope to a quantity including said second slope is representative of said first value of said input signal.

63. The method of claim 62 further including demodulating said first signal by performing the steps of:
measuring said first slope of the first portion of said first signal;
measuring said second slope of the second portion of said first signal;
dividing said first slope of a quantity including said second slope to produce a quantity or signal representative of first value of said input signal.

64. The method of claim 63 wherein the order of said measuring of said first slope and said second slope is reversed.

65. A method of demodulating a first signal having the form of a modulated carrier signal having a first transition including a first portion having a first slope and a second portion having a second slope, wherein the ratio of a quantity including said first slope to a quantity including said second slope is representative of a first value of second signal, said method comprising the steps of:
(a) measuring said first slope of said first portion of said first signal;
(b) measuring said second slope of said second portion of said first signal; and
(c) dividing a quantity including said first slope by quantity including said second slope to produce a quantity or signal that represents said first value of said second signal.

66. A circuit for demodulating a first signal having the form of a modulated carrier signal having a first transition including a first portion having a first slope and a second portion having a second slope, wherein the ratio of a quantity including said first slope to a quantity including said second slope is representative of a first value of second signal, said circuit comprising:
(a) means for measuring said first slope of said first portion of said first signal;
(b) means for measuring said second slope of said second portion of said first signal; and
(c) means for dividing a quantity including said first slope by a quantity including said second slope to produce a quantity or signal that represents said first value of said second signal.

* * * * *